US011837288B2

(12) United States Patent
Matsushita

(10) Patent No.: US 11,837,288 B2
(45) Date of Patent: Dec. 5, 2023

(54) MEMORY DEVICE

(71) Applicant: Kioxia Corporation, Tokyo (JP)

(72) Inventor: Naoki Matsushita, Seoul (KR)

(73) Assignee: Kioxia Corporation, Tokyo (JP)

(*) Notice: Subject to any disclaimer, the term of this patent is extended or adjusted under 35 U.S.C. 154(b) by 273 days.

(21) Appl. No.: 17/470,867

(22) Filed: Sep. 9, 2021

(65) Prior Publication Data

US 2022/0293176 A1 Sep. 15, 2022

(30) Foreign Application Priority Data

Mar. 12, 2021 (JP) .................................. 2021-040502

(51) Int. Cl.
G11C 11/00 (2006.01)
G11C 13/00 (2006.01)

(52) U.S. Cl.
CPC ........ G11C 13/0069 (2013.01); G11C 13/004 (2013.01); G11C 13/0026 (2013.01); G11C 13/0028 (2013.01); G11C 13/0038 (2013.01)

(58) Field of Classification Search
CPC ............ G11C 13/0069; G11C 13/0026; G11C 13/0028; G11C 13/0038; G11C 13/004; G11C 11/161; G11C 13/003; G11C 2013/0073; G11C 2013/0092; G11C 11/1675; G11C 11/1653
See application file for complete search history.

(56) References Cited

U.S. PATENT DOCUMENTS

| 10,153,017 | B2 | 12/2018 | Yang et al. | |
| 2007/0047320 | A1* | 3/2007 | Kim | G11C 11/5628 365/185.22 |
| 2010/0080037 | A1* | 4/2010 | Inoue | G11C 13/0026 365/148 |
| 2010/0328993 | A1* | 12/2010 | Ohmori | G11C 11/1659 365/158 |
| 2011/0261614 | A1* | 10/2011 | Tsukada | G11C 13/0004 365/163 |
| 2014/0301129 | A1* | 10/2014 | Kawai | G11C 13/0069 365/148 |

(Continued)

FOREIGN PATENT DOCUMENTS

| JP | 6672224 B2 | 3/2020 |
| JP | 2020035976 A | 3/2020 |

(Continued)

OTHER PUBLICATIONS

"Electron Work Function of the Elements". Accessible at https://public.wsu.edu/~pchemlab/documents/Work-functionvalues.pdf.

(Continued)

*Primary Examiner* — Hien N Nguyen
(74) *Attorney, Agent, or Firm* — Holtz, Holtz & Volek PC

(57) ABSTRACT

According to one embodiment, a memory device includes: a memory cell including a memory element and a switching element; and a circuit that applies a first write pulse having a first polarity to the memory cell at the time of writing first data in the memory cell and applies a second write pulse having a second polarity different from the first polarity to the memory cell at the time of writing second data in the memory cell. The switching element has polarity dependence according to the first and second polarities.

18 Claims, 10 Drawing Sheets

(56) References Cited

U.S. PATENT DOCUMENTS

2015/0262626 A1\* 9/2015 Hatsuda ................. G11C 5/025
                                                            365/72
2018/0277188 A1\* 9/2018 Fujino ................. G11C 11/1655
2019/0378568 A1   12/2019 Robustelli
2020/0075841 A1   3/2020 Watanabe et al.
2020/0098411 A1   3/2020 Maekawa et al.
2020/0303454 A1\* 9/2020 Furuhashi ........... G11C 11/1675

FOREIGN PATENT DOCUMENTS

TW    1692095 B    4/2020
TW    1715975 B    1/2021

OTHER PUBLICATIONS

"Work function: A bite memo." Accessible at: http://mh.rgr.jp/memo/mq0141.htm.
Wikipedia "Work function", Accessed Jun. 21, 2021, https://en.wikipedia.org/wiki/Work_function.
Lide, "Electron Work Function of the Elements", Handbook of Chemistry and Phsysics, 88th Edition, 2007-2008, p. 12-118.

\* cited by examiner

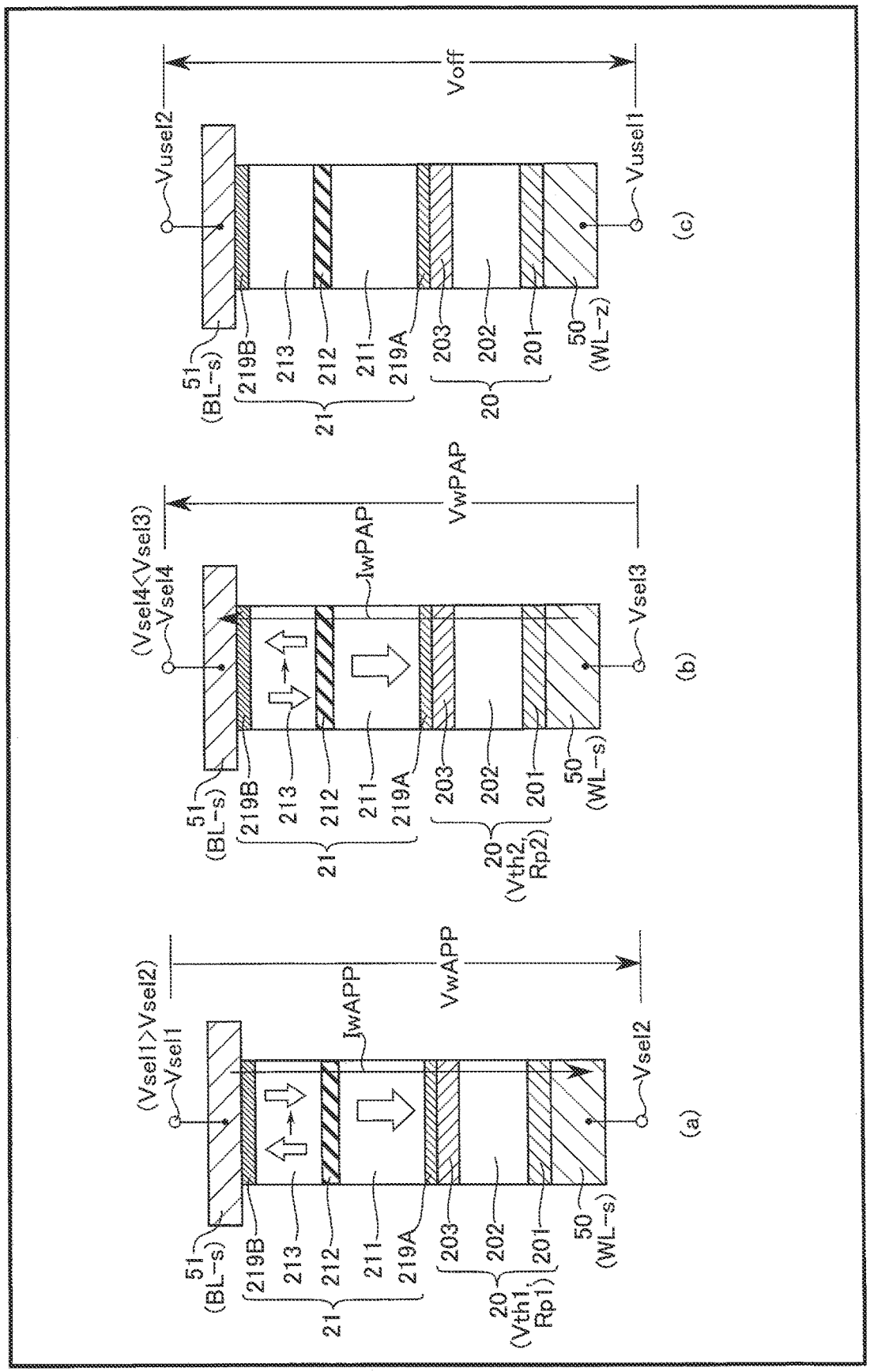
F I G. 6

MEMORY DEVICE

CROSS-REFERENCE TO RELATED APPLICATIONS

This application is based upon and claims the benefit of priority from Japanese Patent Application No. 2021-040502, filed Mar. 12, 2021, the entire contents of which are incorporated herein by reference.

FIELD

Embodiments described herein relate generally to a memory device.

BACKGROUND

A memory device using a variable resistance element (for example, a magnetoresistive effect element) as a memory element is known. In order to improve characteristics of a memory device, research and development of various technologies are promoted.

BRIEF DESCRIPTION OF THE DRAWINGS

FIG. 6 is a diagram for explaining an operation example of the memory device of the first embodiment;

DETAILED DESCRIPTION

Figure 1:
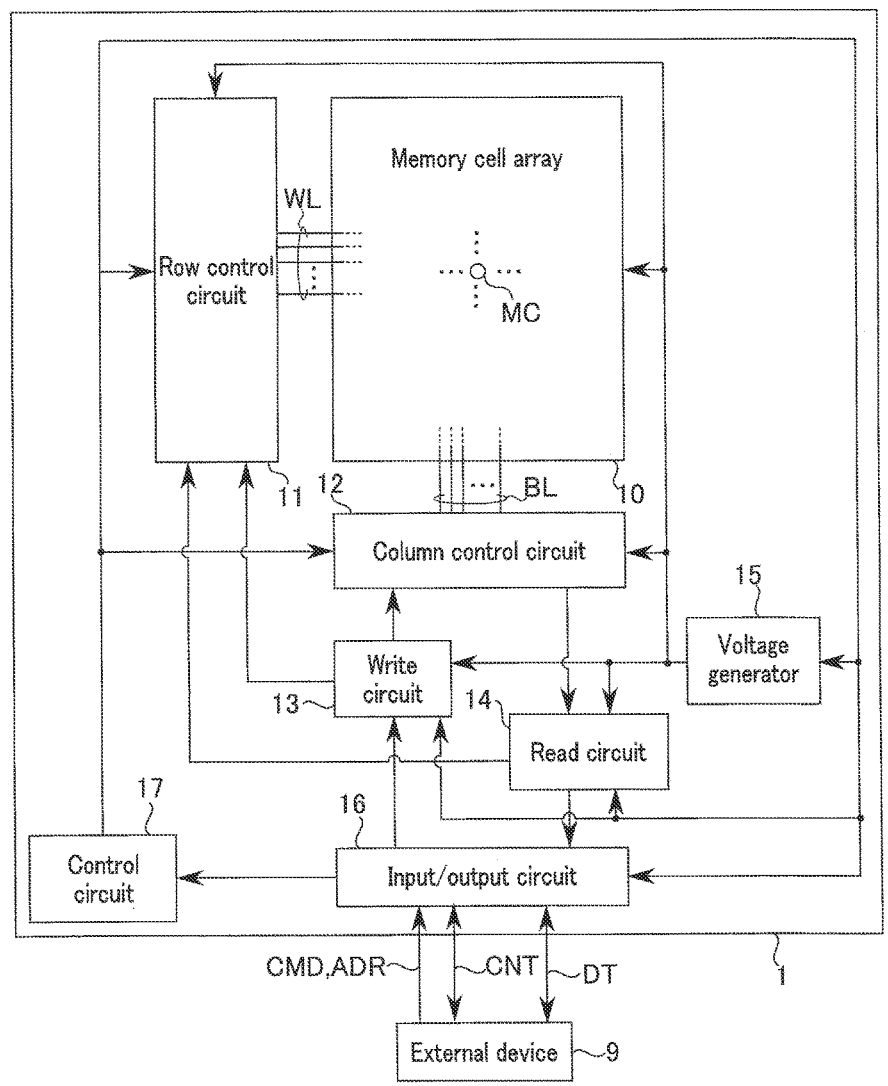
FIG. 1 is a diagram illustrating a configuration example of a memory device according to a first embodiment.

Hereinafter, the present embodiment will be described in detail with reference to the drawings. In the following description, elements having the same function and configuration are denoted by the same reference numerals.

In the following embodiments, for a plurality of identical components (for example, circuits, interconnects, and various voltages and signals), numbers/alphabetical characters may be added to the end of the reference numerals for differentiation.

In a case where components having reference signs with numbers/letters for distinguishing are not necessarily distinguished from each other, a description (reference sign) in which the numbers/letters at the ends are omitted is used.

In general, according to one embodiment, a memory device includes: a memory cell including a memory element and a switching element; and a circuit that applies a first write pulse having a first polarity to the memory cell at the time of writing first data in the memory cell and applies a second write pulse having a second polarity different from the first polarity to the memory cell at the time of writing second data in the memory cell. The switching element has polarity dependence according to the first and second polarities.

Embodiments

A memory device and a method of designing the memory device according to an embodiment will be described with reference to FIGS. 1 to 11.

(1) First Embodiment

A memory device and a method of designing the memory device according to a first embodiment will be described with reference to FIGS. 1 to 8.

(a) Configuration Example (a-1) Overall Configuration

A configuration of a memory device of a first embodiment will be described with reference to FIGS. 1 to 5.

FIG. 1 is a diagram illustrating a configuration example of a memory device according to the present embodiment.

As illustrated in FIG. 1, a memory device 1 of the present embodiment is connected to a device (hereinafter referred to as an external device) 9 outside the memory device 1. The external device 9 transmits a command CMD, an address ADR, and a control signal CNT to the memory device 1. Data DT is transferred between the memory device 1 and the external device 9. The external device 9 sends data (hereinafter, referred to as write data) to be written in the memory device 1 to the memory device 1 at the time of a write operation. The external device 9 receives, from the memory device 1, data (hereinafter, referred to as read data) read from the memory device 1 at the time of a read operation.

The memory device 1 of the present embodiment includes a memory cell array 10, a row control circuit 11, a column control circuit 12, a write circuit 13, a read circuit 14, a voltage generator 15, an input/output circuit 16, and a control circuit 17.

The memory cell array 10 includes a plurality of memory cells MC, a plurality of word lines WL, and a plurality of bit lines BL.

The memory cells MC are associated with a plurality of rows and a plurality of columns in the memory cell array 10. Each of the memory cells MC is connected to a corresponding one of the word lines WL. Each of the memory cells MC is connected to a corresponding one of the bit lines BL.

The row control circuit 11 is connected to the memory cell array 10 via the word line WL. A row address (or a decoding result of a row address) of the memory cell array 10 in the address ADR is supplied to the row control circuit 11. The row control circuit 11 controls the word lines WL based on the decoding result of the row address. As a result, the row control circuit 11 sets each of the word lines WL (the rows) to a selected state or a non-selected state. Hereinafter, the word line WL set to the selected state is referred to as a selected word line WL, and the word line WL other than the selected word line WL is referred to as a non-selected word line WL.

The column control circuit 12 is connected to the memory cell array 10 via the bit line BL. A column address (or a decoding result of a column address) of the memory cell array 10 in the address ADR is supplied to the column control circuit 12. The column control circuit 12 controls the bit lines BL based on the decoding result of the column address ADR. As a result, the column control circuit 12 sets each of the bit lines BL (the columns) to the selected state or the non-selected state. Hereinafter, the bit line BL set to the selected state is referred to as a selected bit line BL, and the bit line BL other than the selected bit line BL is referred to as a non-selected bit line BL.

The write circuit 13 writes data in the memory cell MC. The write circuit 13 supplies a voltage for writing data to each of the selected word line WL and the selected bit line BL. As a result, a write voltage (alternatively, a write current) is supplied to the selected memory cell MC. The write circuit 13 can supply any one of a plurality of the write voltages corresponding to the write data to the selected memory cell MC. For example, each of the write voltages has a polarity (bias direction) corresponding to the write data. For example, the write circuit 13 includes a write driver (not illustrated).

The read circuit 14 reads data from the memory cell MC. The read circuit 14 amplifies a signal output from the selected memory cell MC to the selected bit line BL. The read circuit 14 determines the data in the memory cell MC based on the amplified signal. For example, the read circuit 14 includes a preamplifier (not illustrated) and a sense amplifier (not illustrated).

The voltage generator 15 generates voltages for various operations of the memory cell array 10 using a power supply voltage provided from the external device 9. For example, the voltage generator 15 generates various voltages used for the write operation. The voltage generator 15 outputs the generated voltage to the write circuit 13. For example, the voltage generator 15 generates various voltages used for the read operation. The voltage generator 15 outputs the generated voltage to the read circuit 14.

The input/output circuit 16 functions as an interface circuit of the various signals ADR, CMD, CNT, and DT between the memory device 1 and the external device 9. The input/output circuit 16 transfers the address ADR from the external device 9 to the control circuit 17. The input/output circuit 16 transfers the command CMD from the external device 9 to the control circuit 17. The input/output circuit 16 transfers the various control signals CNT between the external device 9 and the control circuit 17. The input/output circuit 16 transfers the write data DT from the external device 9 to the write circuit 13. The input/output circuit 16 transfers the data DT from the read circuit 14 to the external device 9 as the read data.

The control circuit (also referred to as a sequencer, a state machine, or an internal controller) 17 decodes the command CMD. The control circuit 17 controls operations of the row control circuit 11, the column control circuit 12, the write circuit 13, the read circuit 14, the voltage generator 15, and the input/output circuit 16 in the memory device 1 based on the decoding result of the command CMD and the control signal CNT. The control circuit 17 decodes the address ADR. The control circuit 17 sends the decoding result of the address to the row control circuit 11, the column control circuit 12, and the like. Note that a circuit for decoding the command (command decoder) and a circuit for decoding the address (address decoder) may be provided in the memory device 1 outside the control circuit 17.

(a-2) Memory Cell Array

A configuration example of the memory cell array in the memory device of the present embodiment will be described with reference to FIGS. 2 to 4.

Figure 2:
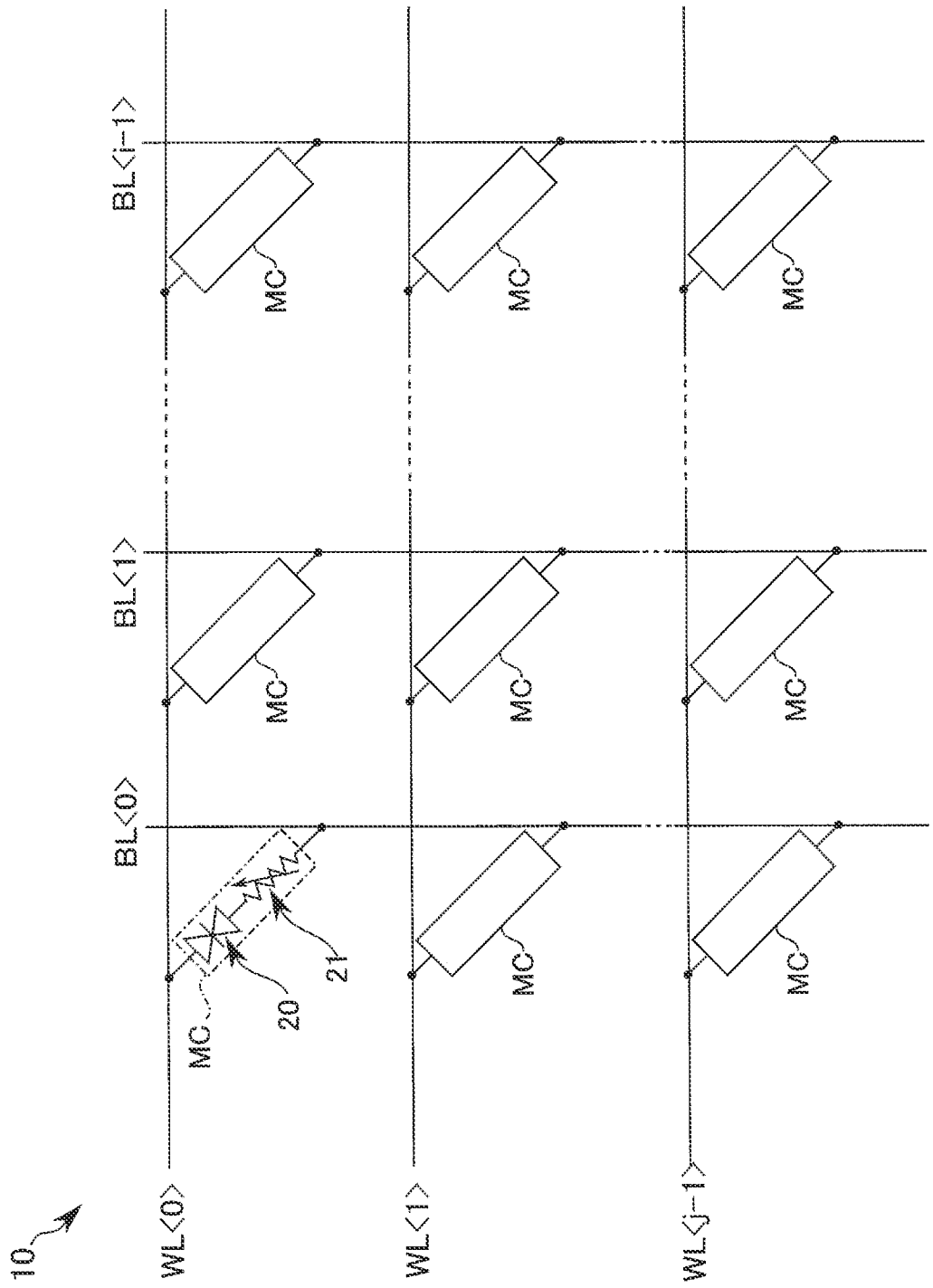
FIG. 2 is a circuit diagram of a memory cell array of the memory device according to the first embodiment.

FIG. 2 is an equivalent circuit diagram illustrating a configuration example of the memory cell array of the memory device of the present embodiment.

As illustrated in FIG. 2, the memory cells MC are arranged in a matrix in the memory cell array 10. Each of the memory cells MC is connected to a corresponding one of the bit lines BL (BL<0>, BL<1>, . . . , BL<i−1>) and a corresponding one of the word lines WL (WL<0>, WL<1>, . . . , WL<j−1>). i and j are integers of 2 or more.

Each of the memory cells MC includes a switching element 20 and a memory element (variable resistance element) 21.

The switching element 20 functions as a selection element of the memory cell MC. The switching element 20 has a function of controlling supply of a voltage (or a current) to the memory element 21 at the time of writing and reading data to and from the corresponding memory element 21.

For example, when a voltage of a certain polarity applied to a certain memory cell MC is lower than a threshold voltage, in the polarity, of the switching element 20 in the memory cell MC, the switching element 20 is set to an OFF state (a high resistance state, a non-conductive state). In this case, the switching element 20 cuts off a voltage (or a current) to the memory element 21. When a voltage of a certain polarity applied to a certain memory cell MC is equal to or higher than the threshold voltage, in the polarity, of the switching element 20 of the memory cell MC, the switching element 20 is set to an ON state (a low resistance state, a conductive state). In this case, the switching element 20 supplies a voltage (or a current) to the memory element 21.

The switching element 20 can switch whether to cause a current to flow in the memory cell MC according to a magnitude of the voltage applied to the memory cell MC regardless of a direction of the current flow in the memory cell.

For example, the switching element 20 is a two-terminal element.

The memory element 21 is a variable resistance element. A resistance state of the memory element 21 is changed to a plurality of resistance states (for example, a low resistance state and a high resistance state) by the supplied voltage (or current). The memory element 21 can store data by associating the resistance state of the element 21 with data (for example, "0" data and "1" data).

Figure 3:
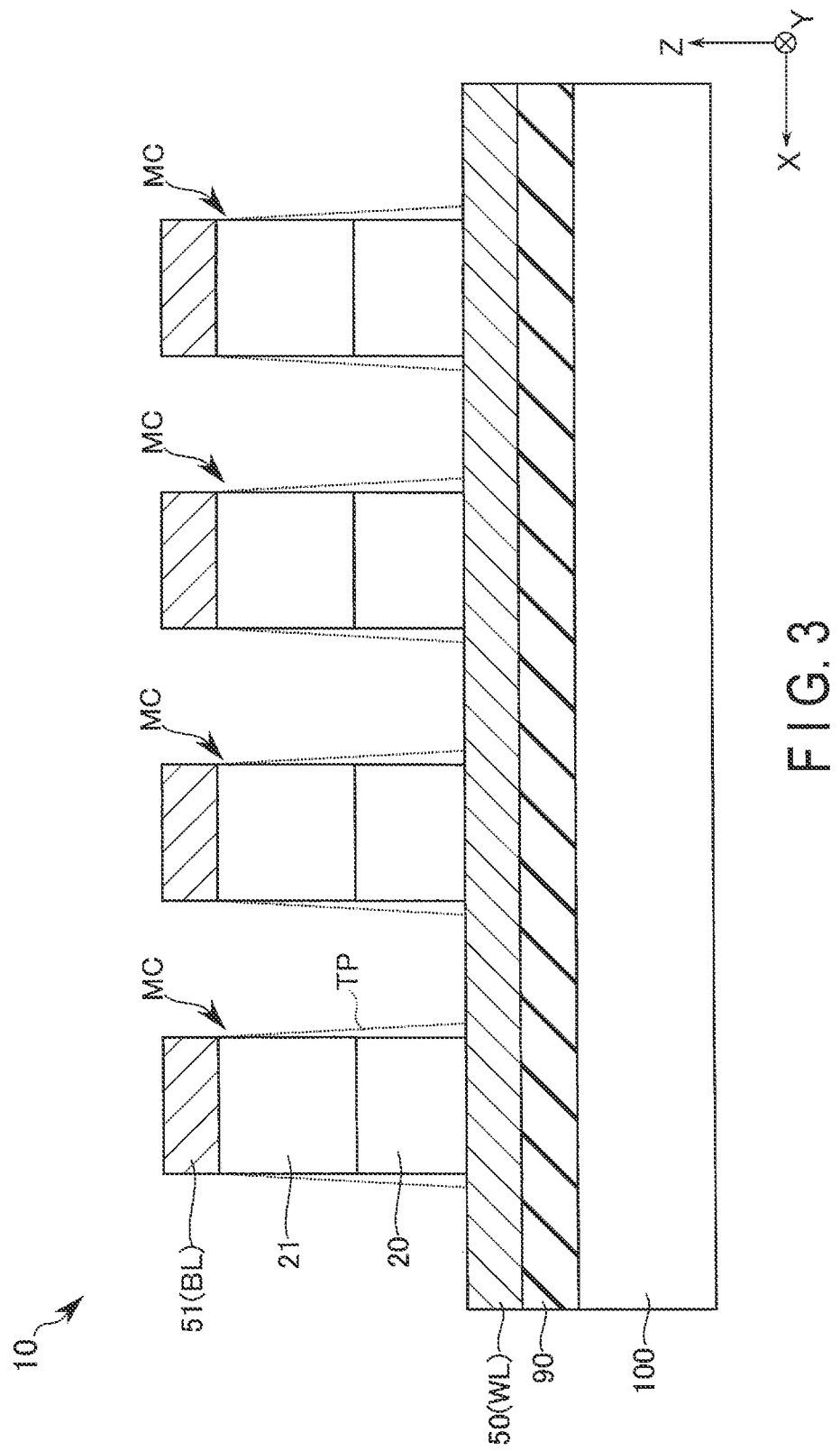
FIGS. 3 and 4 are cross-sectional views illustrating a structure example of the memory cell array of the memory device of the first embodiment.
Figure 4:
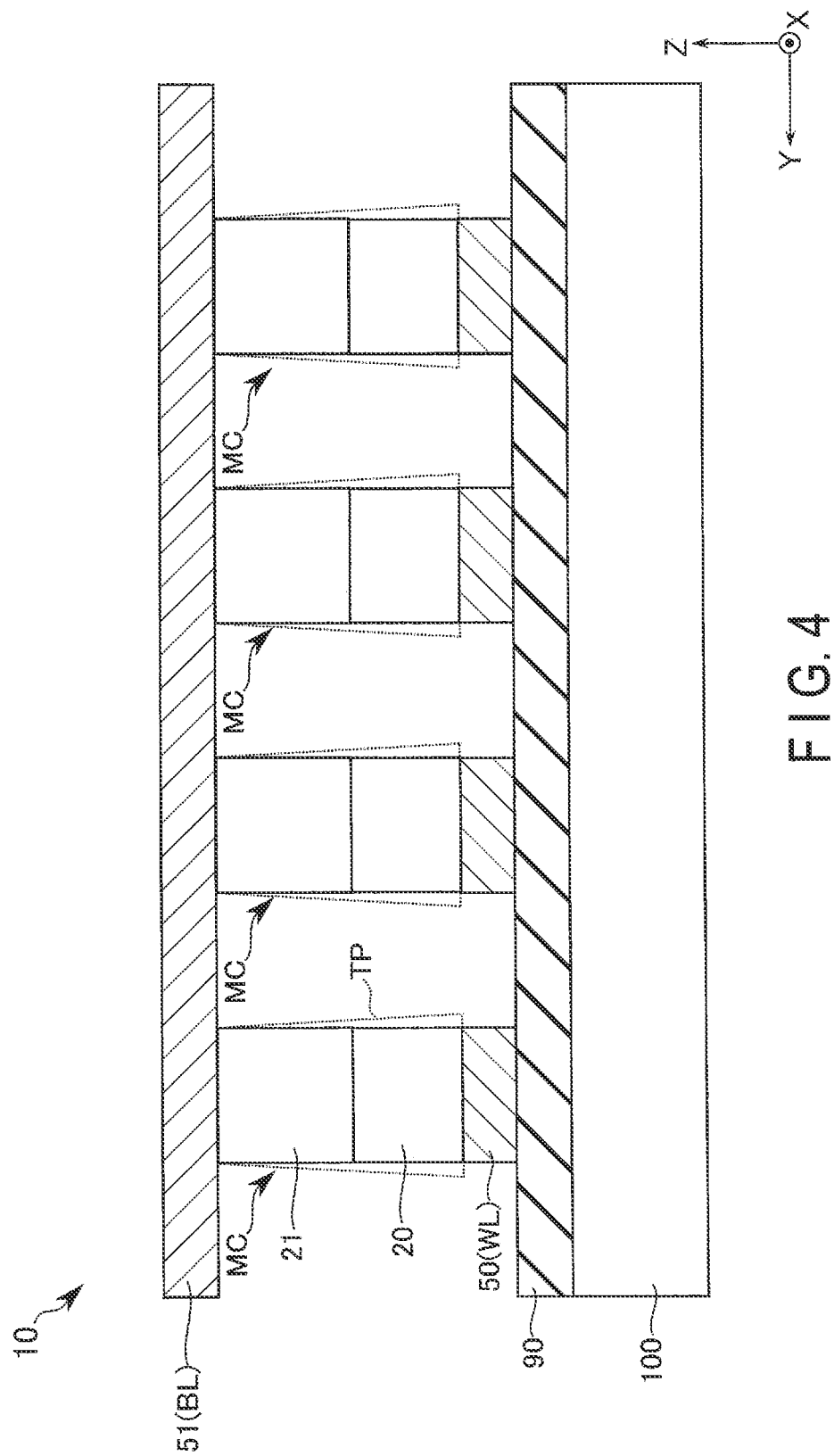

FIGS. 3 and 4 are diagrams for explaining a structure example of the memory cell array of the memory device of the present embodiment. FIG. 3 is a schematic cross-sectional view illustrating a cross-sectional structure along an X direction (axis) of the memory cell array. FIG. 4 is a schematic cross-sectional view illustrating a cross-sectional structure along a Y direction (axis) of the memory cell array.

As illustrated in FIGS. 3 and 4, the memory cell array 10 is provided above an upper surface of a substrate 100.

Hereinafter, a plane parallel to the upper surface of the substrate 100 is referred to as an X-Y plane. A direction (axis) perpendicular to the X-Y plane is a Z direction (Z axis).

A plurality of conductive layers 50 are provided above the upper surface of the substrate 100 via an insulating layer 90 in the Z direction. The conductive layers 50 are arranged along the Y direction. Each of the conductive layers 50 extends along the X direction. The conductive layers 50 function as, for example, the word lines WL.

The conductive layers 51 are provided above the conductive layers 50 in the Z direction. The conductive layers 51 are arranged along the X direction. Each of the conductive layers 51 extends along the Y direction. The conductive layers 51 function as, for example, the bit lines BL.

The memory cells MC are provided between the conductive layers 50 and the conductive layers 51. The memory cells MC are arranged in a matrix in the X-Y plane.

The memory cells MC arranged in the X direction are provided on one conductive layer 50. The memory cells MC arranged in the X direction are connected to a common word line WL.

The memory cells MC arranged in the Y direction are provided under one conductive layer 51. The memory cells MC arranged in the Y direction are connected to a common bit line BL.

For example, in the memory cell array 10 having the circuit configuration of FIG. 2, the switching element 20 is provided below the memory element 21 in the Z direction. The switching element 20 is provided between the memory element 21 and the conductive layer (word line) 50. The memory element 21 is provided between the conductive layer 51 and the switching element 20.

A structure of the memory cell array 10 having the circuit configuration of FIG. 2 is not limited to the example of FIG. 3 or 4. For example, the switching element 20 may be provided above the memory element 21 in the Z direction. In this case, the conductive layer 50 is used as the bit line BL, and the conductive layer 51 is used as the word line WL.

The memory cell MC may have a tapered cross-sectional shape according to a process used for forming the memory cell array 10, like a shape as indicated by a broken line TP in FIGS. 3 and 4. For example, in the tapered memory cell MC, a dimension of a bottom portion (in the present embodiment, a portion of the memory cell MC on a conductive layer 50 side) of the memory cell MC in a direction parallel to a surface of the substrate 100 is larger than a dimension of a top portion (in the present embodiment, a portion of the memory cell MC on a conductive layer 51 side) of the memory cell MC in the direction parallel to the surface of the substrate 100.

FIGS. 3 and 4 illustrate examples in which the insulating layer 90 is provided between the conductive layers 50 and the substrate 100. When the substrate 100 is a semiconductor substrate, a field effect transistor (not illustrated) may be provided on the upper surface of the substrate 100. The field effect transistor is covered with the insulating layer 90. The field effect transistor on the substrate 100 is a constituent element of a circuit such as the row control circuit 11. The field effect transistor is connected to the memory cell array 10 via a contact plug (not illustrated) and an interconnect (not illustrated) in the insulating layer 90. As described above, a circuit for controlling the operation of the memory cell array 10 may be provided below the memory cell array 10 in the Z direction. When the substrate 100 is an insulating substrate, the conductive layers 50 may be directly provided on the upper surface of the substrate 100 without the insulating layer 90.

The circuit configuration and structure of a stacked type memory cell array 10 are not limited to the examples illustrated in FIGS. 2 to 4. The circuit configuration and structure of the memory cell array can be appropriately modified according to a connection relationship between the switching element 20 and the memory element 21 to the bit line BL and the word line WL.

(a-3) Memory Cell

Figure 5:
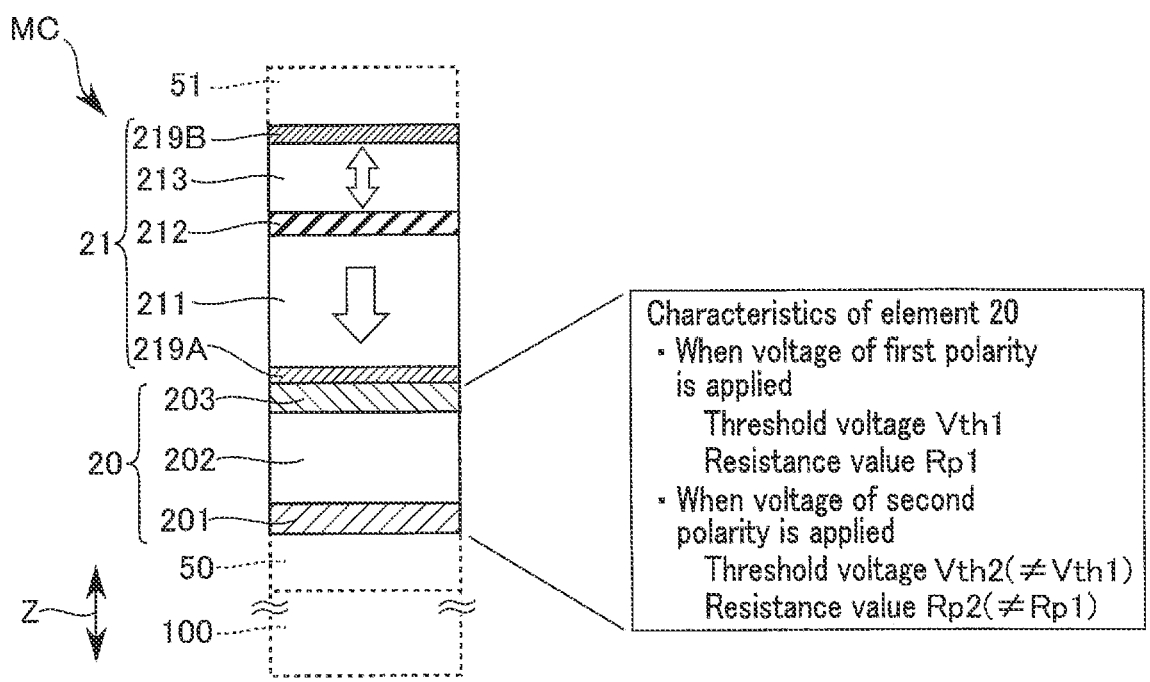
FIG. 5 is a cross-sectional view illustrating a structure example of a memory cell of the memory device of the first embodiment.

FIG. 5 is a cross-sectional view illustrating a structure example of the memory cell in the memory device of the present embodiment.

As illustrated in FIG. 5, the memory cell MC is a stack including the switching element 20 and the memory element 21. In each of the memory cells MC, the switching element 20 and the memory element 21 are arranged in the Z direction.

In the above-described examples of FIGS. 2 to 4, in each of the memory cells MC, the memory element (variable resistance element) 21 is provided on the switching element 20 in the Z direction.

For example, the variable resistance element as the memory element 21 is a magnetoresistive effect element. In this case, the memory device of the present embodiment is a magnetic memory such as a magnetoresistive random access memory (MRAM).

For example, the magnetoresistive effect element 21 includes at least two magnetic layers 211 and 213 and a nonmagnetic layer 212. The nonmagnetic layer 212 is provided between the two magnetic layers 211 and 213 in the Z direction. In the examples of FIGS. 2 to 4, the layers 211, 212, and 213 are arranged in the Z direction in the order of the magnetic layer 211, the nonmagnetic layer 212, and the magnetic layer 213 from the word line WL side toward the bit line BL side.

The two magnetic layers 211 and 213 and the nonmagnetic layer 212 form a magnetic tunnel junction (MTJ). Hereinafter, the magnetoresistive effect element 21 including the magnetic tunnel junction is referred to as an MTJ element 21. The nonmagnetic layer 212 in the MTJ element 21 is referred to as a tunnel barrier layer.

The magnetic layers 211 and 213 are ferromagnetic layers including, for example, cobalt, iron, and/or boron. The magnetic layers 211 and 213 may be single-layer films or multilayer films (for example, artificial lattice films). The tunnel barrier layer 212 is, for example, an insulating layer including magnesium oxide. The tunnel barrier layer may be a single-layer film or a multilayer film.

In the present embodiment, the MTJ element 21 is a perpendicular magnetization type magnetoresistive effect element. For example, each of the magnetic layers 211 and 213 has perpendicular magnetic anisotropy. An easy magnetization axis direction of each of the magnetic layers 211 and 213 is perpendicular to layer surfaces (film surfaces) of the magnetic layers 211 and 213. A magnetization direction of each of the magnetic layers 211 and 213 is parallel to an arrangement direction (Z direction) of the magnetic layers 211 and 213. Each of the magnetic layers 211 and 213 has magnetization perpendicular to the layer surfaces of the magnetic layers 211 and 213.

Of the two magnetic layers 211 and 213, one magnetic layer has a variable magnetization direction, and the other magnetic layer has an invariable magnetization direction. The MTJ element 21 may have a plurality of resistance states (resistance values) according to a relative relationship (magnetization alignment) between a magnetization direction of the one magnetic layer and a magnetization direction of the other magnetic layer.

In the example of FIG. 5, the magnetization direction of the magnetic layer 213 is variable. The magnetization direction of the magnetic layer 211 is invariable (fixed state). Hereinafter, the magnetic layer 213 whose magnetization direction is variable is referred to as a storage layer. Hereinafter, the magnetic layer 211 whose magnetization direction is invariable (fixed state) is referred to as a reference layer. Note that the storage layer 213 may also be referred to as a free layer, a magnetization free layer, or a magnetization variable layer. The reference layer 211 may also be referred to as a pin layer, a pinned layer, a magnetization invariable layer, or a magnetization fixed layer.

In the present embodiment, the sentence that "the magnetization direction of the reference layer (magnetic layer) is invariable" or "the magnetization direction of the reference layer (magnetic layer) is in a fixed state" means that, in a case where a current or a voltage for changing the magnetization direction of the storage layer is supplied to the magnetoresistive effect element, the magnetization direction of the reference layer is not changed, by the supplied current or voltage, before and after the supply of the current/voltage.

When the magnetization direction of the storage layer 213 is the same as the magnetization direction of the reference layer 211 (when a magnetization alignment state of the MTJ element 21 is a parallel alignment state), a resistance state of the MTJ element 21 is a first resistance state.

When the magnetization direction of the storage layer 213 is different from the magnetization direction of the reference layer 211 (when the magnetization alignment state of the MTJ element 21 is an antiparallel alignment state), the resistance state of the MTJ element 21 is a second resistance state different from the first resistance state. The resistance value of the MTJ element 21 in the second resistance state (antiparallel alignment state) is higher than the resistance value of the MTJ element 21 in the first resistance state (parallel alignment state).

Hereinafter, regarding the magnetization alignment state of the MTJ element, the parallel alignment state is also referred to as a P state, and the antiparallel alignment state is also referred to as an AP state.

For example, the MTJ element 21 includes two electrodes 219A and 219B. The magnetic layers 211 and 213 and the tunnel barrier layer 212 are provided between the two electrodes 219A and 219B in the Z direction. The reference layer 211 is provided between the electrode 219A and the tunnel barrier layer 212. The storage layer 213 is provided between the electrode 219B and the tunnel barrier layer 212.

For example, a shift cancelling layer (not illustrated) may be provided in the MTJ element 21. The shift cancelling layer is provided between the reference layer 211 and the electrode 219A. The shift cancelling layer is a magnetic layer for mitigating influence of stray field of the reference layer 211.

In a case where the MTJ element 21 includes a shift cancelling layer, a nonmagnetic layer (not illustrated) is provided between the shift cancelling layer and the reference layer 211. The nonmagnetic layer is, for example, a metal layer such as an Ru layer.

The shift cancelling layer is antiferromagnetically bound to the reference layer 211 via the nonmagnetic layer. As a result, a stack including the reference layer 211 and the shift cancelling layer forms a synthetic antiferromagnetic (SAF) structure. In the SAF structure, the magnetization direction of the shift cancelling layer is opposite to the magnetization direction of the reference layer 211. By the SAF structure, the magnetization direction of the reference layer 211 is set to the fixed state.

For example, the MTJ element 21 may include at least one of an underlayer (not illustrated) and a capping layer (not illustrated). The underlayer is provided between the magnetic layer (here, the reference layer) 211 and the electrode 219A. The underlayer is a nonmagnetic layer (for example, a conductive compound layer). The underlayer is a layer for improving characteristics (for example, crystallinity and/or magnetic properties) of the magnetic layer 211 in contact with the underlayer. The capping layer is provided between the magnetic layer (here, the storage layer) 213 and the electrode 219B. The capping layer is a nonmagnetic layer (for example, a conductive compound layer). The capping layer is a layer for improving the characteristics (for example, crystallinity and magnetic properties) of the magnetic layer 213 in contact with the capping layer. The underlayer and the capping layer may be regarded as constituent elements of the electrodes 219 (219A and 219B).

When the switching element 20 is a two-terminal element, the switching element 20 includes at least two electrodes (conductive layers) 201 and 203 and a switching layer 202. The switching layer 202 is provided between the two electrodes 201 and 203 in the Z direction. The switching layer 202 is a variable resistance layer.

A resistance state of the switching layer 202 becomes the high resistance state (non-conductive state) or the low resistance state (conductive state) depending on the voltage applied to the switching element 20 (memory cell MC).

When the resistance state of the switching layer 202 is the high resistance state, the switching element 20 is turned off. When the resistance state of the switching layer 202 is the low resistance state, the switching element 20 is turned on.

When the memory cell MC is set to the selected state, the resistance state of the switching layer 202 is the low resistance state in order to turn on the switching element 20. When the memory cell MC is set to the non-selected state, the resistance state of the switching layer 202 is the high resistance state in order to turn off the switching element 20.

Note that, depending on a material of the switching layer 202, a change in resistance state of the switching layer 202 may rely on a current (for example, a magnitude of the current) flowing in the switching element 20 (memory cell).

The material of the switching layer 202 is, for example, an insulator including a dopant. An example of the insulator used for the switching layer 202 is silicon oxide. When the material of the switching layer 202 is silicon oxide, the dopant to be added to the silicon oxide is arsenic (As) or germanium (Ge). For example, the dopant is added into the switching layer 202 by ion implantation.

The material of the switching layer 202 may be, for example, another material (a conductive or insulating oxide, a conductive or insulating nitride, or a semiconductor). A type of dopant to be added to the switching layer 202 can be changed depending on the material used for the switching layer 202. The type of dopant to be added to the silicon oxide as the switching layer 202 is not limited to the above example.

A material of the electrodes 201 and 203 is selected from a metal, a conductive compound, and a semiconductor. Depending on the material of the switching layer 202, the material of the electrodes 201 and 203 may be selected.

Hereinafter, in the two electrodes 201 and 203 of the switching element 20, the electrode 201 on a substrate side is referred to as a lower electrode. Of the two electrodes 203, the electrode (electrode on an opposite side to the substrate side) 203 disposed above the lower electrode 201 in the Z direction is referred to as an upper electrode. In the example of FIG. 5, the switching element 20 is connected to the MTJ element 21 via the upper electrode 203.

In an MRAM1 including the stacked type memory cell array 10, according to an operation to be executed in the memory cell to be operated (hereinafter, also referred to as a selected cell), a voltage of a first polarity or a voltage of a second polarity is applied to the selected cell. The second polarity is different from the first polarity. A current flowing in the selected cell also has a polarity depending on the polarity of the applied voltage.

In the MRAM1 of the present embodiment, the switching element 20 has polarity dependence according to the polarity of the applied voltage (for example, the write voltage) and/or the polarity of the supplied current (for example, the write current) to the memory cell MC.

For example, a threshold voltage (absolute value) Vth1 of the switching element 20 with respect to the applied voltage of the first polarity is different from a threshold voltage (absolute value) Vth2 of the switching element 20 with respect to the applied voltage of the second polarity.

For example, in the present embodiment, a resistance value Rp1 of the switching element 20 when the applied voltage of the first polarity is applied to the memory cell MC is different from a resistance value Rp2 of the switching element 20 when the applied voltage of the second polarity is applied to the memory cell MC.

(b) Operation Example

An operation example of the MRAM of the present embodiment will be described with reference to FIG. 6.

The external device 9 sends the command CMD according to a request from a user, the address (hereinafter, also referred to as the selected address) ADR of a target to be operated, and the control signal CNT to the MRAM1 of the present embodiment. When data writing is requested, the external device 9 sends the write data DT together with the command and the address to the MRAM1 of the present embodiment.

The MRAM1 of the present embodiment receives the command CMD, the selected address ADR, and the control signal CNT. When the write data is sent, the MRAM1 receives the write data.

In the MRAM1, the control circuit 17 controls the operation of each of the circuits 11 to 16 in the MRAM1 based on the decoding result of the command CMD and the decoding result of the selected address ADR.

The row control circuit 11 selects one word line among the word lines WL based on the decoding result of the selected address ADR. The column control circuit 12 selects one bit line among the bit lines BL based on the decoding result of the selected address ADR. The memory cell between the selected word line and the selected bit line is selected as the memory cell (selected cell) to be operated.

Hereinafter, among the memory cells MC, the memory cells other than the selected cell are referred to as non-selected cells.

The row control circuit 11 applies a voltage having a certain voltage value to the selected word line. The column control circuit 12 applies a voltage having a certain voltage value to the selected bit line.

A potential difference between the selected word line and the selected bit line is supplied to the selected cell as an applied voltage (operating voltage) for the operation of the selected cell. A voltage value of the voltage to be applied to the selected word line and a voltage value of the voltage to be applied to the selected bit line have magnitudes corresponding to the operation to be executed.

The memory cells (hereinafter, non-selected cells) other than the selected cell are present in the memory cell array 10. The non-selected cells are connected to at least one of the non-selected word line and the non-selected bit line. In the stacked type memory cell array 10, the non-selected cells connected to the selected word line and the non-selected bit line and the non-selected cells connected to the non-selected word line and the selected bit line exist at the time of an operation on the selected cell in the memory cell array 10. Hereinafter, the non-selected cells connected to the selected word line and the non-selected bit line and the non-selected cells connected to the non-selected word line and the selected bit line are also referred to as half-selected cells.

At the time of the operation on the selected cell, a voltage of a certain magnitude (hereinafter referred to as non-selected voltage) is applied to the non-selected word line and the non-selected bit line in order to suppress malfunctions of the non-selected cells and the half-selected cells.

When the command is a write command, the write data is written to the selected cell. For example, when the memory cell MC stores 1-bit data, first data (for example, "0" data) or second data (for example, "1" data) is written to the memory cell (selected cell) MC.

In the MRAM1, the magnetization alignment state of the MTJ element 21 is controlled according to the data to be written to the selected cell.

For example, when the MRAM1 executes writing (write operation) of data by a spin transfer torque (STT) method, a write current flowing from the reference layer 211 side to the storage layer 213 side or a write current flowing from the storage layer 213 side to the reference layer 211 side is supplied to the MTJ element 21 according to the data to be written in the selected cell.

In the MRAM1, a magnitude relationship (the polarity of the applied voltage) between a potential of the selected word line and a potential of the selected bit line is controlled according to the data to be written in the selected cell.

FIG. 6 is a schematic diagram for explaining the write operation in the MRAM of the present embodiment.

(a) of FIG. 6 illustrates the write operation of the first data to the memory cell. For example, the first data ("0" data) is associated with the parallel alignment state in the magnetization alignment state of the MTJ element 21.

As shown in (a) of FIG. 6, when the magnetization alignment state of the MTJ element 21 is set to the parallel alignment state (P state) at the time of writing the "0" data, a write current IwAPP is supplied to a selected cell MC-s so as to flow in a direction from the storage layer 213 toward the reference layer 211. The write current IwAPP has a current value equal to or larger than a magnetization reversal threshold of the MTJ element 21. More specifically, the current value of the write current IwAPP is equal to or larger than a magnetization reversal threshold of the storage layer 213 and smaller than a magnetization reversal threshold of the reference layer 211.

In order to generate the write current IwAPP, in the MTJ element 21, a potential on the storage layer 213 side is made higher than a potential on the reference layer 211 side.

In this case, a first selected voltage Vsel1 is applied to an interconnect 51 (in the present embodiment, a selected bit line BL-s) on the storage layer 213 side, and a second selected voltage Vsel2 is applied to an interconnect 50 (in the present embodiment, a selected word line WL-s) on the reference layer 211 side. A voltage value of the first selected voltage Vsel1 is higher than a voltage value of the second selected voltage Vsel2. The selected voltage Vsel1 has, for example, a positive voltage value. The selected voltage Vsel2 is, for example, 0 V.

A potential difference (Vsel1-Vsel2) between the selected bit line BL-s and the selected word line WL-s is applied to the selected cell MC-s as an applied voltage VwAPP for the write operation. Hereinafter, the operating voltage to be applied to the selected cell for the write operation is referred to as the write voltage.

In the present embodiment, a polarity of the write voltage VwAPP applied to the memory cell MC so that the potential on the storage layer 213 side of the MTJ element 21 becomes higher than the potential on the reference layer 211 side of the MTJ element 21 is referred to as a first polarity. In a case where the memory cell array 10 has the configuration of FIGS. 2 to 5, when the write voltage VwAPP of the first polarity is applied, the potential of the interconnect 51 above the MTJ element 21 is higher than the potential of the interconnect 50 below the MTJ element 21.

The switching element 20 in the selected cell MC-s is turned on by the potential difference (write voltage) VwAPP between the selected bit line BL-s and the selected word line WL-s. With respect to the selected cell to which the write voltage VwAPP of the first polarity is applied, the threshold voltage (absolute value) of the switching element 20 is equal to or lower than the write voltage (absolute value) VwAPP.

For example, at the time of writing the "0" data, the switching element 20 in the ON state has the resistance value Rp1.

The write current IwAPP having a polarity corresponding to the polarity of the write voltage VwAPP is generated by the write voltage VwAPP having the first polarity for writing the "0" data. The write current IwAPP generated by the write voltage VwAPP of the first polarity is referred to as the write current IwAPP of the first polarity.

The write current IwAPP having the first polarity flows in the MTJ element 21 from the storage layer 213 toward the reference layer 211.

A spin torque is generated in the MTJ element 21 due to the write current IwAPP. By the spin torque, the magnetization direction of the storage layer 213 is reversed from the opposite direction to the magnetization direction of the reference layer 211 to the same direction as the magnetization direction of the reference layer 211.

As a result, the magnetization alignment state of the MTJ element 21 changes from the AP state to the P state.

As a result, the "0" data is written into the selected cell MC-s. Until the "1" data is written in the selected cell MC-s, the selected cell MC-s can substantially store the written "0" data in a nonvolatile manner.

When the magnetization alignment state of the MTJ element 21 is the P state ("0" data holding state) at the time of supplying the write current IwAPP, even if the write current IwAPP for writing the "0" data flows in the MTJ element 21, reversal of magnetization of the storage layer 213 does not occur. Therefore, at the time of writing the "0" data, rewriting of the data does not occur in the memory cell storing the "0" data.

(b) of FIG. 6 is a schematic diagram for explaining the operation of writing the second data to the memory cell.

For example, the second data ("1" data) is associated with the antiparallel alignment state in the magnetization alignment state of the MTJ element 21.

As shown in (b) of FIG. 6, when the magnetization alignment state of the MTJ element 21 is set to the antiparallel alignment state (AP state) at the time of writing the "1" data, a write current IwPAP is supplied to the selected cell MC-s so as to flow in a direction from the reference layer 211 toward the storage layer 213. In order to generate the write current IwPAP, in the MTJ element 21, the potential on the reference layer 211 side is made higher than the potential on the storage layer 213 side.

In this case, a third selected voltage Vsel3 is applied to the interconnect 50 (in the present embodiment, the selected word line WL-s) on the reference layer 211 side, and a fourth selected voltage Vsel4 is applied to the interconnect 51 (in the present embodiment, the selected bit line BL-s) on the storage layer 213 side. A voltage value of the third selected voltage Vsel3 is higher than a voltage value of the fourth selected voltage Vsel4. The selected voltage Vsel3 has a positive voltage value. The selected voltage Vsel4 is, for example, 0 V.

A potential difference (|Vsel3−Vsel4|) between the selected word line WL-s and the selected bit line BL-s is applied to the selected cell MC-s as a write voltage VwPAP.

In the present embodiment, a polarity of the write voltage VwPAP applied to the memory cell MC so that the potential on the reference layer 211 side of the MTJ element 21 becomes higher than the potential on the storage layer 213 side of the MTJ element 21 is referred to as a second polarity. In a case where the memory cell array 10 has the configuration of FIGS. 2 to 5, when the write voltage VwPAP of the second polarity is applied, the potential of the interconnect 50 below the MTJ element 21 is higher than the potential of the interconnect 51 above the MTJ element 21.

If the polarities of the write voltages VwPAP and VwAPP are different from each other, the absolute value of the voltage value of the write voltage VwPAP may be the same as or different from the absolute value of the voltage value of the write voltage VwPPA. The voltage value of the voltage Vsel3 may be the same as or different from the voltage value of the voltage Vsel1. The voltage value of the voltage Vsel4 may be the same as or different from the voltage value of the voltage Vsel2.

The switching element 20 in the selected cell MC-s is turned on by the write voltage VwPAP. For the selected cell to which the write voltage VwPAP of the second polarity is applied, the threshold voltage (absolute value) of the switching element 20 is equal to or lower than the write voltage (absolute value) VwPAP.

For example, at the time of writing the "1" data, the switching element 20 in the ON state has the resistance value Rp2. A magnitude of the resistance value Rp2 is different from a magnitude of the resistance value Rp1.

The write current IwPAP having a polarity corresponding to the polarity of the write voltage VwPAP is generated by the write voltage VwPAP having the second polarity for writing the "1" data. The write current IwPAP generated by the write voltage VwPAP of the second polarity is referred to as the write current IwPAP of the second polarity.

The write current IwPAP having the second polarity flows in the MTJ element 21 from the reference layer 211 toward the storage layer 213. The write current IwPAP has a current value equal to or higher than the magnetization reversal threshold of the MTJ element 21.

A spin torque is generated in the MTJ element 21 due to the write current IwPAP. By the spin torque, the magnetization direction of the storage layer 213 is reversed from the same direction as the magnetization direction of the reference layer 211 to the opposite direction to the magnetization direction of the reference layer 211.

As a result, the magnetization alignment of the MTJ element 21 changes from the P state to the AP state.

As a result, the "1" data is written into the selected cell MC-s. Until the "0" data is written in the selected cell MC-s, the selected cell MC-s can substantially store the written "1" data in a nonvolatile manner.

When the magnetization alignment of the MTJ element 21 is in the AP state ("1" data holding state) at the time of supplying the write current IwPAP, the reversal of the magnetization of the storage layer 213 does not occur even if the write current IwPAP for writing the "1" data flows in the MTJ element 21. Therefore, at the time of writing the second data, data rewriting does not occur in the memory cell storing the second data.

In the bias state of the applied voltage of the selected cell MC-s, the second polarity is different from the first polarity. Hereinafter, the first polarity is referred to as a negative polarity, and the second polarity is referred to as a positive polarity. The write current IwAPP caused by the write voltage VwAPP having a negative polarity is referred to as a negative-polarity write current. The write current IwPAP caused by the voltage VwPAP having a positive polarity is referred to as a positive-polarity write current.

The bias state of the voltage of the selected cell MC-s when the negative-polarity write voltage VwAPP is applied is referred to as a negative bias state. The bias state of the voltage of the selected cell MC-s when the positive-polarity write voltage VwPAP is applied is referred to as a positive bias state.

Hereinafter, the write voltage VwAPP may be referred to as "−VwAPP (or VwAPP(−))" and the write voltage VwPAP may be referred to as "+VwPAP (or VwPAP(+))" in order to indicate a difference in polarity between the write voltages VwAPP and VwPAP. As long as the potential difference between the selected word line and the selected bit line and the polarity of the write voltage (write current) are set such that predetermined write data is written in the selected cell, the selected voltage having a negative voltage value may be applied to the selected word line or the selected bit line.

For example, according to the polarity dependence of the MTJ element 21, an absolute value (|+VwPAP|) of the write voltage VwPAP may be larger than an absolute value (|−VwAPP|) of the write voltage VwAPP. As a result, a write error rate (WER) in the MTJ element (memory cell) is reduced. Furthermore, characteristics of the MTJ element 21, such as characteristics related to time dependent dielectric breakdown (TDDB) in the MTJ element, are improved.

Hereinafter, the write voltage and the write current for writing data to the memory cell are also collectively referred to as a write pulse.

(c) of FIG. 6 is a schematic diagram for explaining an electrical state of the non-selected cell at the time of the write operation.

As illustrated in (c) of FIG. 6, at the time of the write operation, a non-selected voltage Vusel1 is applied to a non-selected word line WL-z, and a non-selected voltage Vusel2 is applied to a non-selected bit line BL-z.

Each of the non-selected voltages Vusel1 and Vusel2 is, for example, a voltage value of 0 V or more.

A potential difference (hereinafter, referred to as an OFF voltage) Voff between the non-selected word line WL-z and the non-selected bit line BL-z is smaller than the write voltage (absolute value). A current equal to or higher than a magnetization reversal threshold current of the MTJ element 21 does not flow in a non-selected cell MC-z to which a voltage Voff is applied. When the off voltage Voff is applied to the non-selected cell MC-z, the switching element 20 is turned off.

As described above, at the time of the operation on the selected cell, the half-selected cell exists in the memory cell array 10.

The voltage values of the non-selected voltages Vusel1 and Vusel2 are set so as not to cause a malfunction of the half-selected cell.

In the writing of the first data ("0"), the voltage values of the non-selected voltages Vusel1 and Vusel2 are set as follows.

The voltage value of the non-selected voltage Vusel1 is set such that the potential difference between the non-selected voltage Vusel1 and the selected voltage Vsel2 is smaller than the write voltage VwAPP. For example, the voltage value of the non-selected voltage Vusel1 has a voltage value between the voltage value of the selected voltage Vsel1 and the voltage value of the selected voltage Vsel2.

For example, when the voltage value of the non-selected voltage Vusel1 is the same as a value of half the potential difference between the voltage value of the selected voltage Vsel1 and the voltage value of the selected voltage Vsel2, a voltage VwAPP/2 having a voltage value of about half the voltage value of the write voltage VwAPP is applied to the half-selected cell connected to the selected bit line BL-s.

In this case, in the MTJ element 21 in the half-selected cell connected to the selected bit line BL-s, the potential on the storage layer 213 side is higher than the potential on the reference layer 211 side.

The voltage value of the non-selected voltage Vusel2 is set such that a potential difference between the non-selected voltage Vusel2 and the selected voltage Vsel1 is smaller than the write voltage VwAPP. For example, the voltage value of the non-selected voltage Vusel2 has a voltage value between the voltage value of the selected voltage Vsel1 and the selected voltage Vsel2.

For example, when the voltage value of the non-selected voltage Vusel2 is the same as a value of half the potential difference between the voltage value of the selected voltage Vsel1 and the voltage value of the selected voltage Vsel2, the voltage VwAPP/2 is applied to the half-selected cell connected to the selected word line WL-s.

In this case, in the MTJ element 21 in the half-selected cell connected to the selected word line WL-s, the potential on the storage layer 213 side is higher than the potential on the reference layer 211 side.

When voltage values of non-selected voltages Vusel1 and Vusel2 are set as described above at the time of writing the "0" data, the direction of the polarity of the voltage applied to the half-selected cell is the same as the direction of the polarity (negative polarity) of the write voltage VwAPP.

At the time of the "0" data write operation, the switching elements in the non-selected cell and the half-selected cell are desirably turned off in order to suppress malfunctions of the non-selected cell and the half-selected cell and/or noise to the selected cell.

The threshold voltage (absolute value) Vth1 of the switching element at the time of writing the "0" data is set such that threshold voltage Vth1 is higher than the voltage (absolute value) VwAPP/2 and equal to or lower than the write voltage VwAPP.

In the writing of the second data ("1"), the voltage values of the non-selected voltages Vusel1 and Vusel2 are set as follows.

The voltage value of the non-selected voltage Vusel1 is set such that a potential difference (absolute value) between the non-selected voltage Vusel1 and the selected voltage Vsel4 is smaller than the voltage value (absolute value) of the write voltage VwPAP. For example, the voltage value of the non-selected voltage Vusel1 has a voltage value between the voltage value of the selected voltage Vsel3 and the voltage value of the selected voltage Vsel4.

For example, when the voltage value of the non-selected voltage Vusel1 is the same as a value of half the potential difference between the voltage value of the selected voltage Vsel3 and the voltage value of the selected voltage Vsel4, a voltage VwPAP/2 having a voltage value of about half the voltage value of the write voltage VwAPP is applied to the half-selected cell connected to the selected bit line BL-s.

In this case, in the MTJ element 21 in the half-selected cell connected to the selected bit line BL-s, the potential on the storage layer 213 side is lower than the potential on the reference layer 211 side.

The voltage value of the non-selected voltage Vusel2 is set such that a potential difference between the non-selected voltage Vusel2 and the selected voltage Vsel3 is smaller than the write voltage VwPAP. For example, the voltage value of the non-selected voltage Vusel2 has a voltage value between the voltage value of the selected voltage Vsel3 and the selected voltage Vsel4.

For example, when the voltage value of the non-selected voltage Vusel2 is the same as a value of half the potential difference between the voltage value of the selected voltage Vsel3 and the voltage value of the selected voltage Vsel4, the voltage VwPAP/2 is applied to the half-selected cell connected to the selected word line WL-s.

In this case, in the MTJ element 21 in the half-selected cell connected to the selected word line WL-s, the potential on the storage layer 213 side is lower than the potential on the reference layer 211 side.

When the voltage values of the non-selected voltages Vusel1 and Vusel2 are set as described above at the time of writing the "1" data, the direction of the polarity of the voltage applied to the half-selected cell is the same as the direction of the polarity (positive polarity) of the write voltage VwPAP.

At the time of the "1" data write operation, the switching elements in the non-selected cell and the half-selected cell are desirably turned off in order to suppress malfunctions of the non-selected cell and the half-selected cell and/or noise to the selected cell.

The threshold voltage (absolute value) Vth2 of the switching element at the time of writing the "1" data is set such that threshold voltage Vth2 is higher than the voltage (absolute value) VwAPP/2 and equal to or lower than the write voltage VwAPP.

As described above, at the time of the write operation in the selected cell, the non-selected voltages Vusel1 and Vusel2 having a certain voltage value are applied to the non-selected word line WL-z and the non-selected bit line BL-z.

As a result, it is possible to suppress a malfunction of the non-selected cell at the time of the write operation in the selected cell.

Note that the read operation from the MRAM1 of the present embodiment is executed using a known technique.

Therefore, in the present embodiment, the description of the read operation from the MRAM1 is omitted.

In the MRAM1 of the present embodiment, the switching element 20 has dependence according to the polarity of the applied voltage (for example, the write voltage). As a result, in the MRAM1 of the present embodiment, the switching element 20 to which the voltage is applied exhibits different characteristics depending on the polarity of the applied voltage.

As a result, the MRAM1 of the present embodiment can suppress a decrease in operation margin of the MRAM1 (memory cell MC).

(c) Design Example

A design example (design method) of the switching element having polarity dependence on the applied voltage in the MRAM1 of the present embodiment will be described with reference to FIGS. 7 and 8.

Figure 7:
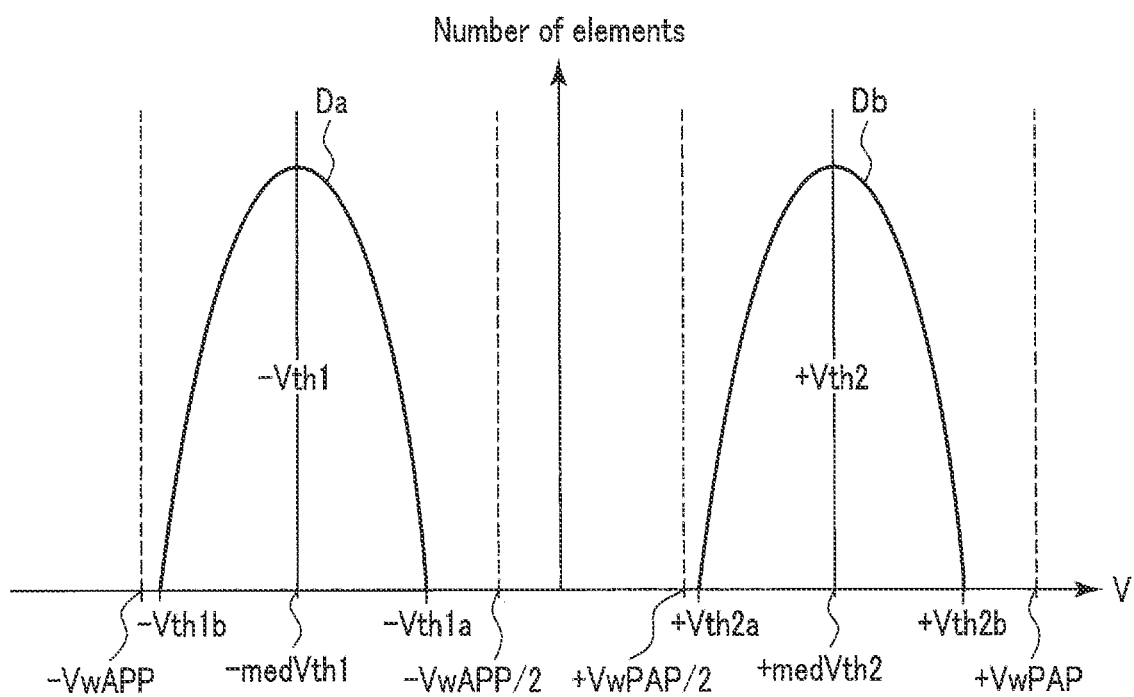
FIGS. 7 and 8 are diagrams for explaining the memory device of the first embodiment.

FIG. 7 is a diagram for explaining a relationship between the threshold voltage of the switching element of the memory cell and the write voltage in the MRAM1 of the present embodiment.

A horizontal axis in FIG. 7 corresponds to the voltage (voltage value), and a vertical axis in FIG. 7 corresponds to a number of the elements.

In FIG. 7, the voltage (voltage value) at the time of writing the "0" data is indicated by a negative polarity (negative value), and the voltage (voltage value) at the time of writing the "1" data is indicated by a positive polarity (positive value).

Hereinafter, the threshold voltage of the switching element 20 at the time of writing the "0" data is referred to as "−Vth1". The threshold voltage of the switching element 20 at the time of writing the "1" data is referred to as "+Vth2". Hereinafter, when the threshold voltages of "−Vth1" and "+Vth2" are not distinguished, the threshold voltage is described as "Vth".

In FIG. 7, the "VwAPP" and "VwPAP" indicate the above-described write voltages of different polarities, and also indicate voltage values of the voltages.

Hereinafter, when the write voltages VwAPP and VwPAP are not distinguished, the write voltage is referred to as "Vw".

As illustrated in FIG. 7, a distribution Da of the threshold voltage "−Vth1" of the switching element 20 in the "0" data writing is provided within a voltage range between the voltage value "−VwAPP" and the voltage value "−VwAPP/2".

A distribution db of the threshold voltage "+Vth2" of the switching element 20 in the "1" data writing is provided within a voltage range between the voltage value "+VwPAP/2" and the voltage value "+VwPAP".

As described above, when the magnitudes of the write voltages VwAPP and VwPAP are set according to the polarity dependence of the MTJ element, the absolute values of the write voltages VwAPP and VwPAP have a relationship of "|−VwAPP|<|+VwPAP|". Provided that |−VwAPP| may be the same as |+VwPAP|.

A median value of the threshold voltage of the switching element 20 in the threshold voltage distribution Da is referred to as "−medVth1". A median value of the threshold voltage of the switching element 20 in the threshold voltage distribution db is referred to as "+medVth2".

Hereinafter, when the "−medVth1" and the "+medVth2" are not distinguished, the median value of the threshold voltage is referred to as "medVth".

For example, the threshold voltage distributions Da and db have a normal distribution.

A standard deviation ($\sigma_{vth}$) of the "Vth" can be indicated using a percentage (s %) of the "medVth". The $\sigma_{vth}$ and medVth have a relationship of "$\sigma_{vth}$=medVth×s/100". The "s" has a value of 0 or more and 100 or less.

For example, the normal distribution of the threshold voltage distributions Da and db is indicated as "Vth~N (medVth, (medVth×(s/100)$^2$))".

When the operation margin in the MRAM1 is indicated by "n×$\sigma_{vth}$", "n×$\sigma_{vth}$" can be indicated as "medVth×n×s/100". Here, "n" is a number of samples (positive integer). Note that the "n×$\sigma_{vth}$" can also be regarded as a value related to the write error rate of the MRAM1.

Based on the operation margin (n×$\sigma_{vth}$)) in the write operation, a relationship between the write voltage "Vw" and the threshold voltage of the switching element having the normal distribution is expressed by the following Formula (A) and Formula (B).

$$Vw/2 < \text{medVth} - n \times \sigma_{vth} = \text{medVth} \times (1 - n \times s/100) \quad (A)$$

$$\text{medVth} \times (1 + n \times s/100) < Vw \quad (B)$$

Formula (A) corresponds to a relationship between a voltage value "−Vth1a" (absolute value) at an upper limit of the threshold voltage distribution (top tail of the distribution) Da and the voltage value "−Vw/2 (=−VwAPP/2)" (absolute value) and a relationship between a voltage value "+Vth2a" (absolute value) at a lower limit of the threshold voltage distribution db (bottom tail of the distribution) and the voltage value "Vw/2 (=+VwPAP/2)" (absolute value).

As described above, the voltage value "Vw/2", which is a possible value of the non-selected voltage to be applied to the non-selected word line and bit line, corresponds to the voltage value of the voltage to be applied to the half-selected cell at the time of the write operation.

Formula (B) corresponds to a relationship between a voltage value "−Vth1b" (absolute value) at a lower limit of the threshold voltage distribution Da (bottom tail of the distribution) and the write voltage "Vw (=−VwAPP)" (absolute value), and a relationship between a voltage value "+Vth2b" (absolute value) at an upper limit of the threshold voltage distribution db (top tail of the distribution) and the write voltage "Vw (=+VwPAP)" (absolute value).

Formula (C) is obtained based on Formula (A) and Formula (B).

$$\text{medVth} \times (1 + n \times s/100) < Vw < \text{medVth} \times 2 \times (1 - n \times s/100) \quad (C)$$

When the absolute value of the negative-polarity write voltage VwAPP and the absolute value of the positive-polarity write voltage VwPAP have a relationship of "VwAPP<VwPAP", Formula (C) can be expressed as the following Formula (D).

$$\text{medVth} \times (1 + n \times s/100) < \text{VwAPP} < \text{VwPAP} < \text{medVth} \times 2 \times (1 - n \times s/100) \quad (D)$$

Here, the magnitudes of the write voltages VwAPP and VwPAP set according to the polarity dependence of the MTJ element (polarity dependence of the write voltages) are assumed using a coefficient "a" as in the following Formula (E).

$$\text{VwPAP} = a \times \text{VwAPP} \quad (E)$$

In Formula (E), "a" has a value greater than 1.

Note that the coefficient "a" is a coefficient (hereinafter, also referred to as a polarity dependence coefficient of the MTJ element) indicating the polarity dependence of the MTJ element 21 on the write voltages VwAPP and VwPAP (or the write currents IwAPP and IwPAP) having different polarities. "a" can be represented by a voltage ratio between the write voltages VwAPP and VwPAP (or a current ratio between the write currents IwAPP and IwPAP).

The polarity dependence of the threshold voltage of the switching element 20 at the time of the write operation is assumed as in the following Formula (F) using the median values of the threshold voltages.

$$\text{medVth2} = b \times \text{medVth1} \quad (F)$$

"medVth1" indicates the median value of the threshold voltage Vth1 of the switching element 20 in a case where the negative-polarity write voltage VwAPP(−) is applied to the selected cell (at the time of writing the "0" data).

"medVth2" indicates the median value of the threshold voltage Vth2 of the switching element 20 in a case where the positive-polarity write voltage VWPAP(+) is applied to the selected cell (at the time of writing the "1" data). "medVth1" and "medVth2" are represented by absolute values.

In Formula (F), "b" is a value of 1 or more (b≥1).

Note that a coefficient "b" is a coefficient indicating the polarity dependence of the switching element 20 on the write voltages VwAPP and VwPAP (or the write currents IwAPP and IwPAP) having different polarities. "b" can be represented by a voltage ratio of the threshold voltages of the switching element 20 to the respective write voltages VwAPP and VwPAP (or a ratio of the threshold voltages of the switching element 20 to the respective write currents IwAPP and IwPAP).

Hereinafter, the median values medVth1 and medVth2 in the threshold voltage distributions of the switching element 20 may be regarded as the threshold voltages of the switching element 20 as representative values (reference values) of the threshold voltages of the switching element 20 with respect to the respective write voltages VwAPP and VwPAP.

In the present embodiment, the polarity dependence of the switching element 20 is verified based on the coefficient "a" in Formula (E) and the coefficient "b" in Formula (F).

<<Case where Switching Element does not have Polarity Dependence on Applied Voltage>>

When the switching element does not have polarity dependence on the applied voltage, "b" in Formula (F) is 1. In this case, the median value medVth2 of the threshold voltage of the switching element 20 with respect to the write voltage VwPAP is equal to the median value medVth1 of the threshold voltage of the switching element 20 with respect to the write voltage VwAPP. Here, "medVth1" and "medVth2" are referred to as "medVth".

Based on Formula (E), Formula (D) can be expressed as the following Formula (G0). medVth×(1+n×s/100)<VwAPP<medVth×2×(1−n×s/100)/a . . . (G0)

In this case, the following Formula (G1) is obtained based on Formula (G0).

$$(1 + n \times s/100) < 2 \times (1 - n \times s/100)/a \quad (G1)$$

Formula (G1) is expressed as the following Formula (G2).

$$0 < 2 \times (1 - n \times s/100)/a - (1 + n \times s/100) \quad (G2)$$

Formula (G2) is expressed as the following Formula (G3).

$$0 < 2 \times (1 - n \times s/100) - a \times (1 + n \times s/100) \quad (G3)$$

Furthermore, Formula (G3) is expressed as the following Formula (G4).

$$0 < (2 - a) - (2 + a) \times n \times s/100 \quad (G4)$$

The following Formula (H) is obtained based on Formula (G4).

$$n \times s/100 < (2 - a)/(2 + a) \quad (H)$$

Based on Formula (H), it is indicated that a variation "n×s/100" in the threshold voltage of the switching element 20 is smaller than "(2−a)/(2+a)".

A range of the value "a" that satisfies Formula (H) is "1<a<2".

Figure 8:
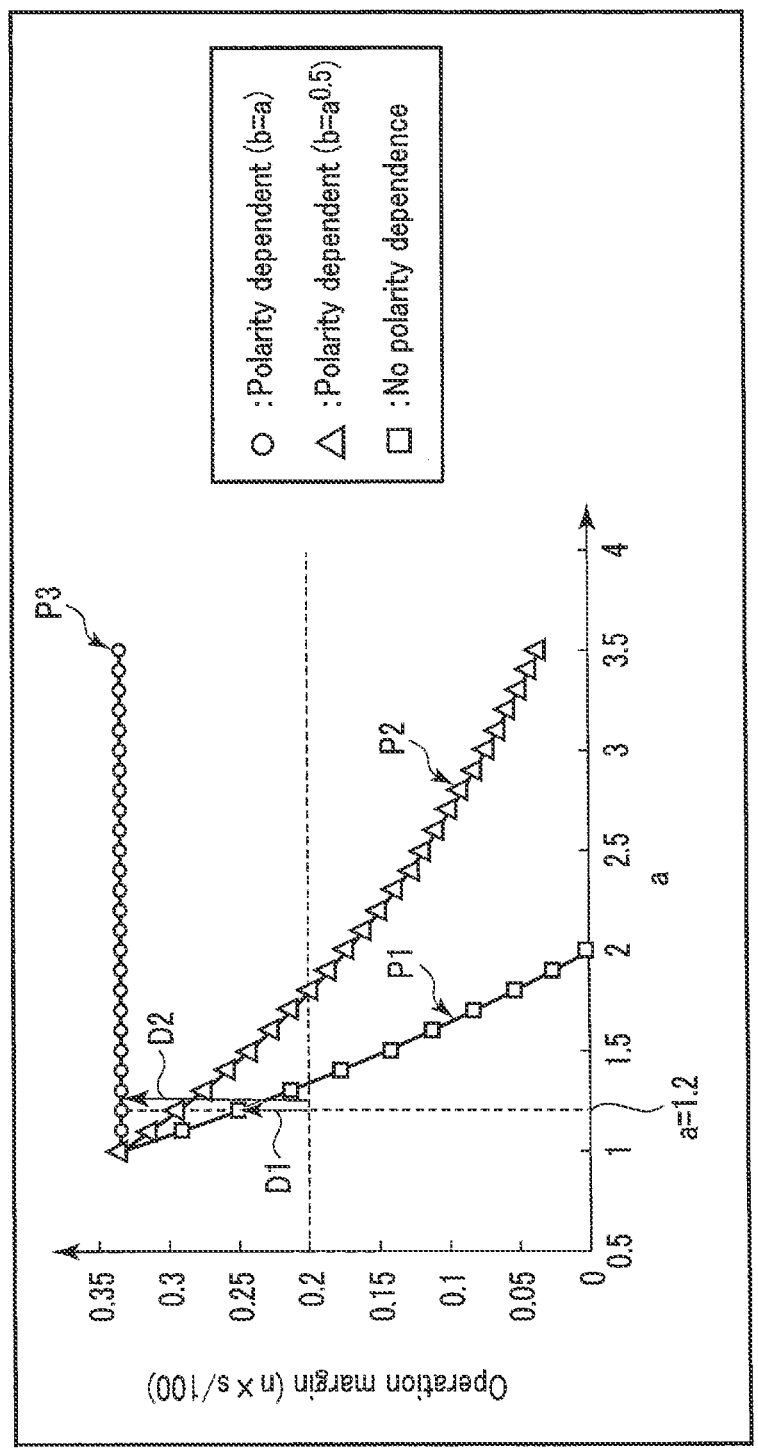

FIG. 8 is a graph illustrating a relationship between the operation margin of the MRAM and the value "a" in the MRAM of the present embodiment.

A line P1 indicates the relationship between the coefficient "a" indicating a voltage ratio between the two write voltages VwAPP and VwPAP having different polarities and the operation margin of the MRAM when the threshold voltage of the switching element 20 does not have dependence on the polarity of the write voltage.

The line P1 (line including a square plot) indicates a relationship between the coefficient "a" and the operation margin "n×s/100" based on Formula (H).

For example, an operation margin D1 in a case where the polarity dependence coefficient (voltage ratio between the write voltages |VwPAP/VwAPP|) "a" of the MTJ element is 1.2 is about 5% higher, with respect to the threshold voltage of the switching element, than the operation margin as the reference value of 0.2.

<<Case where Switching Element has Polarity Dependence on Applied Voltage>>

When the switching element has polarity dependence on the applied voltage (when b≠1 in Formula (F)), "a" and "b" are expressed by the following relational formula.

With respect to the write voltage VwAPP, the above Formula (C) is expressed as the following Formula (I1).

$$medVth1 \times (1+n \times s/100) < VwAPP < medVth1 \times 2 \times (1-n \times s/100) \quad (I1)$$

With respect to the write voltage VwPAP, the above Formula (C) is expressed as the following Formula (I2).

$$medVth2 \times (1+n \times s/100) < VwPAP < medVth2 \times 2 \times (1-n \times s/100) \quad (I2)$$

The following Formula (J) is obtained from Formula (I2) based on the relationships shown in the above Formulas (E) and (F).

$$medVth1 \times (1+n \times s/100) \times b/a < VwAPP < medVth1 \times 2 \times (1-n \times s/100) \times b/a \quad (J)$$

As in Formula (J), the negative-polarity write voltage VwAPP (absolute value) can be expressed by a relational formula using "a" and "b".

When b/a>1 (when b>a), the following Formula (K1) is obtained from Formula (I1) and Formula (J).

$$medVth1 \times (1+n \times s/100) \times b/a < medVth1 \times 2 \times (1-n \times s/100) \quad (K1)$$

A left side of Formula (K1) is a left side of Formula (J), and a right side of Formula (K1) is a right side of Formula (I1).

Formula (K1) is expressed as the following Formula (K2).

$$(1+n \times s/100) \times b/a < 2 \times (1-n \times s/100) \quad (K2)$$

Formula (K2) is expressed as the following Formula (K3).

$$0 < (2 - 2 \times n \times s/100) - (1+n \times s/100) \times b/a \quad (K3)$$

Formula (K3) is expressed as the following Formula (K4).

$$0 < (2a-b) - (2a+b) \times n \times s/100 \quad (K4)$$

Based on Formula (K4), the variation in the threshold voltage of the switching element is expressed as Formula (KM) below.

$$n \times s/100 < (2a-b)/(2a+b) \quad (K5)$$

Note that the above Formulas (H) and (K5) have a relationship of the following Formula (L).

$$(2-a)/(2+a) < (2a-b)/(2a+b) \quad (L)$$

Based on Formula (L), the relationship of "b<$a^2$" is obtained.

Therefore, in a case where b>a, the relationship between "b" and "a" is "b<$a^2$", whereby the operation margin of the MRAM1 of the present embodiment is large.

In the case of "b/a<1" (case of b<a), the operation margin of the MRAM of the present embodiment is expressed as the following Formula (M1) using Formula (I1) and Formula (J).

$$medVth1 \times (1+n \times s/100) < medVth1 \times 2 \times (1-n \times s/100) \times b/a \quad (M1)$$

A left side of Formula (M1) is a left side of Formula (I1), and a right side of Formula (M) is a right side of Formula (J).

Formula (M1) is expressed as the following Formula (M2).

$$1+n \times s/100 < 2 \times (1-n \times s/100) \times b/a \quad (M2)$$

Formula (M2) is expressed as the following Formula (M3).

$$0 < 2b - 2b \times n \times s/100 - a - a \times n \times s/100 \quad (M3)$$

Formula (M2) is expressed as the following Formula (M3).

$$0 < (2b-a) - (2b+a) \times n \times s/100 \quad (M4)$$

Based on Formula (M4), the variation in the threshold voltage of the switching element is expressed as Formula (M5) below.

$$n \times s/100 < (2b-a)/(2b+a) \quad (M5)$$

The above Formulas (H) and (M5) have a relationship of the following Formula (N).

$$(2-a)/(2+a) < (2b-a)/(2b+a) \quad (N)$$

Based on Formula (N), the relationship of "b>a" is obtained.

Based on the above, in a case where b>a, when "b" has a relationship of "1<b", the operation margin of the MRAM1 of the present embodiment is large.

In FIG. 8, a line P2 and a line P3 indicate the relationship between the coefficient "a" indicating the voltage ratio between the two write voltages VwAPP and VwPAP having different polarities and the operation margin of the MRAM when the threshold voltage of the switching element 20 has dependence on the polarity of the write voltage.

The line P2 (line including a triangle plot) indicates a relationship between the coefficient "a" and the operation margin "n×s/100" based on Formula (L). The line P2 indicates transition of the operation margin in a case where "b" and "a" are "b=$a^{0.5}$".

The line P3 (line including a circle plot) indicates a relationship between the coefficient "a" and the operation margin based on Formula (N). The line P3 indicates transition of the operation margin in a case where "b" and "a" are "b=a".

As illustrated in FIG. 8, a value of the operation margin related to the line P2 and a value of the operation margin related to the line P3 are higher than a value of the operation margin related to the line P1.

In this manner, the threshold voltage of the switching element has polarity dependence on the write voltage, whereby the operation margin of the MRAM can be improved.

For example, when the values of the operation margins in a case where the value of the polarity dependence coefficient (voltage ratio of the write voltage) "a" of the MTJ element is "1.2" are compared, with respect to the reference value of 0.2, the operation margin D2 based on Formula (L) is improved by about 13% as compared with the operation margin (operation margin in a case where the switching element does not have polarity dependence) D1 based on Formula (H).

As shown by line P3, when the value of "b" is equal to the value of "a", the operation margin based on Formula (N) can maintain a value of 0.3 or more without substantially depending on the value of "a".

In this case, the operation margin based on Formula (N) can obtain the highest value.

Here, the relationship between the operation margin of the MRAM and the polarity dependence of the switching element has been described using the write voltages VwPAP and VwAPP of different polarities.

However, the relationship between the operation margin of the MRAM and the polarity dependence of the switching element also has the same relationship as described above for the write currents IwAPP and IwPAP of different polarities.

(d) Summary

The MRAM of the present embodiment includes the memory element (for example, the MTJ element) 21 and the switching element 20 in the memory cell MC.

In the MRAM of the present embodiment, the write pulse having the first polarity (the write voltage and/or the write current) or the write pulse having the second polarity is supplied to the memory cell according to the write data to the memory cell.

In the MRAM of the present embodiment, the switching element has polarity dependence according to the write pulses having different polarities. Depending on the polarity dependence on the write pulse, the characteristic (for example, at least one of the threshold voltage and the resistance value) of the switching element at the time of supplying the write pulse of the first polarity is different from the characteristic of the switching element at the time of supplying the write pulse of the second polarity.

As a result, the MRAM of the present embodiment can improve the operation margin of the memory cell.

In the present embodiment, the switching element has the following magnitude of polarity dependence.

The MTJ element 21 has polarity dependence indicated by the coefficient "a" on the two write voltages having different polarities. "a" is a value based on the ratio between the absolute value of the positive-polarity write voltage VwPAP and the absolute value of the negative-polarity write voltage VwAPP (polarity dependence coefficient of the MTJ element).

The switching element 20 has polarity dependence indicated by the coefficient "b" on the two write voltages having different polarities. "b" is a value based on the ratio between the threshold voltage (median value of threshold voltage distribution) of the switching element when the positive-polarity write voltage VwPAP is applied and the threshold voltage (median value of threshold voltage distribution) of the switching element when the negative-polarity write voltage VwAPP is applied (polarity dependence coefficient of the switching element).

In the MRAM of the present embodiment, "a" and "b" have a relationship of "$1<b<a^2$". As a result, the MRAM of the present embodiment can improve the operation margin.

For example, when the value of "b" is the same as the value of "a", the magnitude of the operation margin may be the maximum value.

As described above, when the switching element in the memory cell has polarity dependence on the polarity of the write voltage as in the MRAM of the present embodiment, the operation margin can be improved.

Therefore, the memory device of the present embodiment can improve the characteristics of the memory device.

(2) Second Embodiment

A memory device and a method of designing the memory device according to a second embodiment will be described with reference to FIGS. 9 and 10.

As described below, in the memory device (for example, an MRAM) of the present embodiment, polarity dependence of a switching element on write voltages of different polarities can be controlled.

<<Material of Switching Element>>

In an MRAM1 of the present embodiment, polarity dependence of a switching element 20 of a memory cell MC can be controlled based on selection of materials of layers used for the switching element 20.

For example, the polarity dependence of the switching element 20 on the polarity of applied write voltages VwAPP and VwPAP can be controlled based on a combination of the material of a switching layer 202 and materials of electrodes 201 and 203.

Due to a difference between work functions of the materials of the electrodes 201 and 203 and a work function of the material of the switching layer 202, a potential barrier arises between the electrodes 201 and 203 and the switching layer 202.

In the two-terminal type switching element 20, when the work function of the material of one electrode (for example, the lower electrode 201) is different from the work function of the material of the other electrode (for example, the upper electrode 203), a magnitude of the potential barrier between the lower electrode 201 and the switching layer 202 is different from a magnitude of the potential barrier between the upper electrode 203 and the switching layer 202.

The potential barrier on the upper electrode 203 side and the potential barrier on the lower electrode 201 side are modulated depending on the polarity of the voltage applied to the switching element 20.

As a result, the threshold voltage of the switching element 20 changes depending on the polarities of the write voltages VwAPP and VwPAP.

As described above, when different materials are used for the upper electrode 203 and the lower electrode 201, the characteristics of the switching element 20 have polarity dependence according to the polarity of the write voltage. The magnitude of the polarity dependence (for example, the value of "b" in the above Formula (F)) of the switching element 20 can be controlled according to the materials used for the electrodes 201 and 203.

For example, when the material of the switching layer 202 is silicon oxide, the materials of the electrodes 201 and 203 are tantalum (Ta), tungsten (W), copper (Cu), hafnium (Hf), titanium nitride (TiN), or the like. A selected one of these materials is used as the material of one electrode, and a material different from the material selected for one electrode among these materials is used as the material of the other electrode.

The work function of the material used for the electrode has a value corresponding to a crystal structure and a crystal plane of the layer made of the material.

A work function of tantalum has a value in the range of 4.0 eV to 4.8 eV. A work function of tungsten has a value in the range of 4.32 eV to 5.22 eV. A work function of copper has a value in the range from 4.53 eV to 5.10 eV. A work function of hafnium has a value in the range from 3.5 eV to 3.9 eV. A work function of titanium nitride is, for example, 4.7 eV.

The materials of the electrodes 201 and 203 are not limited to the above materials, and can be appropriately changed according to the material of the switching layer 202.

The magnitude of the polarity dependence of the switching element 20 can be controlled according to surface roughness of each layer at a boundary (interface) between the switching layer 202 and the electrodes 201 and 203, film thicknesses of the switching layer 202 and the electrodes 201 and 203, crystallinity (crystal structure) of the switching layer 202 and the electrodes 201 and 203, and the like, in addition to the materials of the switching layer 202 and the electrodes 201 and 203.

Figure 9:
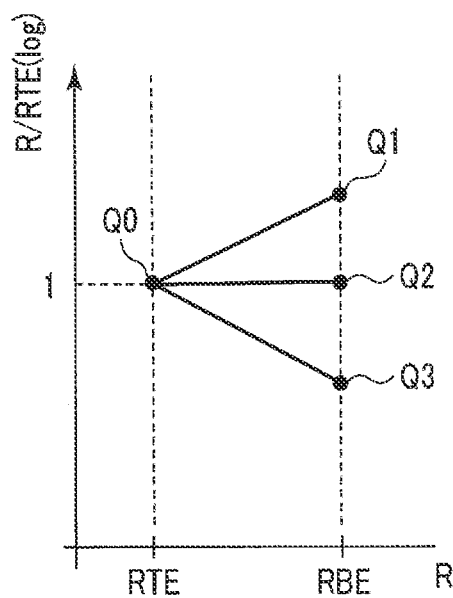
FIGS. 9 and 10 are diagrams for explaining a memory device according to a second embodiment.

FIG. 9 is a graph for explaining an example of control of the polarity dependence of the switching element in the MRAM of the present embodiment.

FIG. 9 illustrates a relationship between a resistance value RTE and a resistance value RBE of the switching element regarding the materials of a lower electrode BE and an upper electrode TE.

The resistance value RTE indicates a resistance value of the switching element in a bias state (for example, at the time of a write operation by the write voltage of a positive polarity illustrated in FIG. 6B) in which a potential of the upper electrode is higher than a potential of the lower electrode.

The resistance value RBE indicates a resistance value of the switching element in a bias state (for example, at the time of the write operation by the write voltage of a negative polarity illustrated in FIG. 6A) in which the potential of the lower electrode is higher than the potential of the upper electrode.

A vertical axis of the graph of FIG. 9 corresponds to a ratio (R/RTE) of a resistance value R of the switching element to the resistance value RTE. The vertical axis of the graph of FIG. 9 is indicated on a log scale.

The resistance values RBE and RTE are indicated as samples on a horizontal axis of the graph of FIG. 9. However, the horizontal axis of the graph of FIG. 9 does not indicate a magnitude relationship between the resistance values RBE and RTE.

According to FIG. 9, the polarity dependence of the switching element is shown by normalization based on the resistance value RTE. Therefore, as indicated by a point Q0 in FIG. 9, when "R" is "RTE", the value of "R/RTE" is "1".

In a case where the polarity dependence of the switching element is controlled according to the materials of the upper electrode and the lower electrode, the value of "R/RTE=RBE/RTE" changes according to the combination of the materials used for the electrodes.

The point Q1 in FIG. 9 indicates a value of "RBE/RTE" when the material of the lower electrode and the material of the upper electrode are silicon nitride (SiN).

When silicon nitride is used as the materials of the lower electrode and the upper electrode as at the point Q1, the value of "RBE/RTE" is "1".

This indicates that the switching element in which silicon nitride is used for both the lower electrode and the upper electrode has substantially no polarity dependence on the applied voltage (or the supplied current).

A point Q2 in FIG. 9 indicates a value of "RBE/RTE" when the material of the lower electrode is titanium nitride (TiN) and the material of the upper electrode is SiN.

When titanium nitride is used for the lower electrode and silicon nitride is used for the upper electrode as at the point Q2, the value of "RBE/RTE" is smaller than 1.

This indicates that the switching element in which titanium nitride is used for the lower electrode and silicon nitride is used for the upper electrode has polarity dependence on the applied voltage (or the supplied current).

When "RBE/RTE" is smaller than 1 as at the point Q2, the resistance value RBE of the switching element is lower than the resistance value RTE of the switching element.

When silicon nitride is used for the lower electrode and titanium nitride is used for the upper electrode, the value of "RBE/RTE" is larger than 1.

A point Q3 in FIG. 9 indicates a value of "RBE/RTE" when both the material of the lower electrode and the material of the upper electrode are titanium nitride.

As at the point Q3, when titanium nitride is used for the lower electrode and the upper electrode, the value of "RBE/RTE" is larger than 1.

This indicates that the switching elements in which titanium nitride is used for the lower electrode and the upper electrode have polarity dependence on the applied voltage (or the supplied current). As described above, even when the material of the lower electrode is the same as the material of the upper electrode, the switching element may have polarity dependence on the applied voltage (the supplied current) depending on the materials used for the electrodes.

When "RBE/RTE" is larger than 1 as at the point Q3, the resistance value RBE of the switching element is higher than the resistance value RTE of the switching element.

As at the points Q2 and Q3, the resistance values RBE and RTE of the switching element with respect to the applied voltage (or the supplied current) change according to the materials of the upper electrode and the lower electrode of the switching element.

Further, as at points Q2 and Q3, a direction (magnitude relationship between the resistance values RBE and RTE) of the polarity dependence of the switching element on the applied voltage (or the supplied current) changes according to the materials of the upper electrode and the lower electrode of the switching element.

In the example of FIG. 9, the SiN layer or the TiN layer used for the electrode may be provided between the switching layer and the metal layer.

As described with reference to FIG. 9, the magnitude of the polarity dependence of the switching element on the applied voltage can be controlled according to the material used for the switching element.

<<Condition for Forming Switching Element>>

In the MRAM of the present embodiment, the polarity dependence of the switching element on the applied voltage (or the supplied current) can be controlled by controlling a condition for forming the switching layer. In order to control the polarity dependence of the switching element, for example, a composition of the switching layer (composition ratio among additive elements), type of the additive elements of the switching layer, and/or a condition for implanting the additive elements are controlled.

Figure 10:
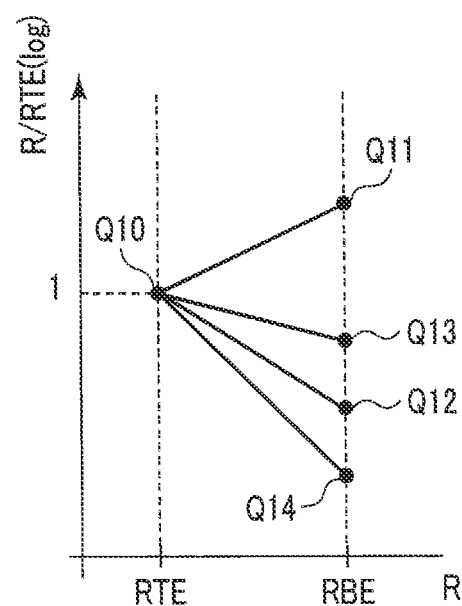

FIG. 10 is a graph for explaining an example of control of the polarity dependence of the switching element in the MRAM of the present embodiment.

FIG. 10 illustrates the relationship between the resistance value RTE and the resistance value RBE of the switching element regarding the condition for forming the switching element.

A vertical axis of the graph of FIG. 10 corresponds to the ratio (R/RTE) of the resistance value R of the switching element to the resistance value RTE. The vertical axis of the graph of FIG. 10 is indicated on a log scale. The resistance values RBE and RTE are indicated as samples on a horizontal axis of the graph of FIG. 10. However, the horizontal axis of the graph of FIG. 10 does not indicate the magnitude relationship between the resistance values RBE and RTE.

FIG. 10 illustrates a relationship between the condition for ion implantation into the switching layer (for example, silicon oxide layer) and the polarity dependence of the switching element.

As in the example of FIG. 9, when the polarity dependence of the switching element is indicated by normalization based on the resistance value RTE, the value of "R/RTE" related to "RTE" is "1" as at a point Q10 in FIG. 10.

A point Q11 in FIG. 10 indicates a value of "RBE/RTE" when arsenic (As) is implanted into the switching layer of the switching element by ion implantation.

When arsenic is implanted into the switching layer as at the point Q11, the value of "RBE/RTE" is larger than 1.

This indicates that the switching element having the switching layer into which arsenic is implanted has polarity dependence on the applied voltage (or the supplied current).

When "RBE/RTE" is larger than 1 as at point Q11, the resistance value RBE of the switching element is larger than the resistance value RTE of the switching element.

A point Q12 in FIG. 10 indicates a value of "RBE/RTE" in a case where germanium (Ge) is implanted into the switching layer by ion implantation.

When germanium is implanted into the switching layer as at the point Q12, the value of "RBE/RTE" is smaller than 1.

This indicates that the switching element having the switching layer into which germanium is implanted has polarity dependence on the applied voltage (or the supplied current).

When "RBE/RTE" is smaller than 1 as at the point Q12, the resistance value RBE of the switching element is lower than the resistance value RTE of the switching element.

As illustrated in the examples of the points Q11 and Q12, the direction of the polarity dependence of the switching element (magnitude relationship between the resistance values RBE and RTE) can be changed according to the ion species implanted into the switching layer.

A point Q13 in FIG. 10 indicates a value of "RBE/RTE" in a case where germanium (Ge) is implanted into the switching layer with a relatively high dose amount by ion implantation. For example, the dose amount of germanium at the point Q13 is higher than the dose amount of germanium at the point Q12.

When germanium is implanted into the switching layer at the point Q13 as in the case of the point Q12, the value of "RBE/RTE" is smaller than 1.

The value of "RBE/RTE" in the case where germanium is implanted into the switching layer under the ion implantation condition of a relatively high dose amount as at the point Q13 is larger than that in the case of the point Q12.

The relationship between the points Q12 and Q13 indicates that, regarding the dose amount of germanium, the magnitude of the "RBE/RTE" changes according to the change in dose amount.

For example, as the dose amount of germanium increases, the resistance value RBE increases as compared with the change in resistance value RTE.

Therefore, regarding the condition for the ion implantation, the magnitude of the polarity dependence of the switching element on the applied voltage (or the supplied current) can be controlled by controlling the dose amount of ions with respect to the switching layer.

A point Q14 in FIG. 10 indicates a value of "RBE/RTE" in a case where germanium (Ge) is implanted into the switching layer with relatively high acceleration energy by ion implantation. For example, an acceleration energy of the ion implantation at the point Q14 is higher than an acceleration energy of the ion implantation at the point Q12.

When germanium is implanted into the switching layer at the point Q14 as in the case of the point Q12, the value of "RBE/RTE" is smaller than 1.

The value of "RBE/RTE" in the case where germanium is implanted into the switching layer under the ion implantation condition of relatively high acceleration energy as at the point Q14 is smaller than that in the case of the point Q12.

The relationship between the points Q12 and Q14 indicates that, regarding the acceleration energy of the ion implantation, the magnitude of the resistance value RBE with respect to the resistance value RTE changes according to the change in acceleration energy.

For example, as the acceleration energy of the ion increases, the resistance value RBE decreases as compared with the change in resistance value RTE.

Therefore, regarding the condition for the ion implantation, the magnitude of the polarity dependence of the switching element on the applied voltage (or the supplied current) can be controlled by controlling the acceleration energy of the ions with respect to the switching layer.

As described above, the polarity dependence of the switching element on the applied voltage (or the supplied current) can be controlled according to the ion species to be implanted, the dose amount, and the acceleration energy with respect to the ion implantation on the switching layer.

As described with reference to FIG. 10, the magnitude of the polarity dependence of the switching element on the applied voltage can be controlled according to the control of the condition for forming the switching element (for example, condition for implantation of impurities into the switching layer).

Regarding the control of the polarity of the switching element which has been described with reference to FIGS. 9 and 10, also in a case where a write current having a polarity according to the write voltage is supplied to the switching element, the control of the polarity dependence of the switching element shows a tendency according to the polarity of the supplied write current.

As described above, the memory device (for example, the MRAM) of the present embodiment can control the polarity dependence of the switching element on the applied voltages of a plurality of polarities. As a result, the memory device of the present embodiment can improve the operation margin of the memory device.

Therefore, the memory device of the second embodiment can improve the operating characteristics of the memory device.

(3) Third Embodiment

A memory device and a method of designing the memory device according to a third embodiment will be described with reference to FIG. 11.

In the memory devices (for example, the MRAMs) of the first and second embodiments, the switching element has polarity dependence on the write voltages having a plurality of polarities.

In the MRAM of the present embodiment, a memory element (here, an MTJ element) has polarity dependence on the write voltages (or write currents) having a plurality of polarities. As described above, regarding an operation margin of the MRAM, the polarity dependence of a switching element on the write voltage has a correlation with the polarity dependence of the MTJ element on the write voltage. Therefore, a possible range of the polarity dependence of the switching element also changes according to the control of the polarity dependence (polarity dependence coefficient) of the MTJ element.

As described below, the polarity dependence of the MTJ element on the write voltages having a plurality of polarities is controlled. Note that, in the MRAM of the present embodiment, the polarity dependence of both the MTJ element and the switching element may be controlled, or the polarity dependence of the MTJ element alone may be controlled.

Figure 11:
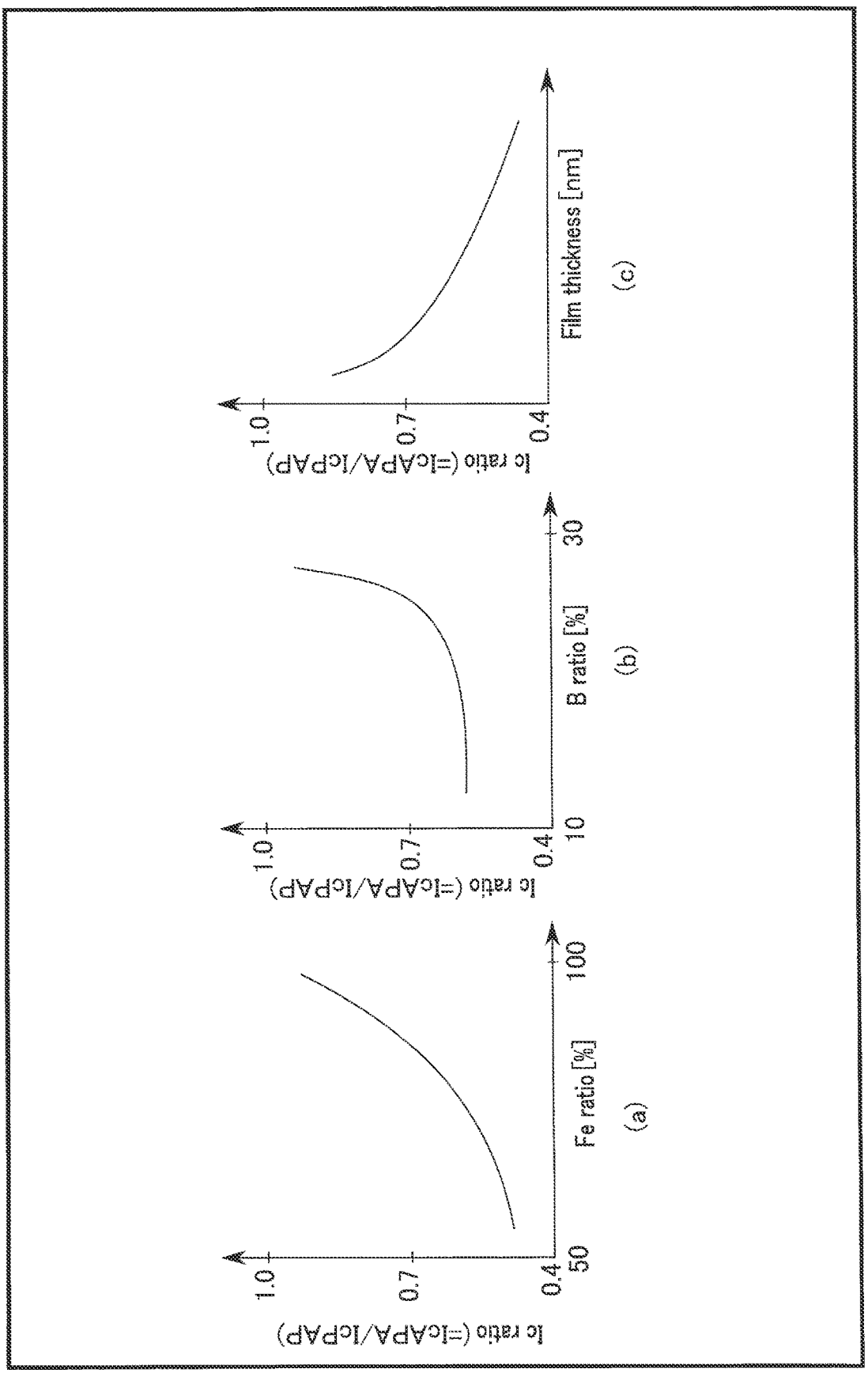
FIG. 11 is a diagram for explaining a memory device of a third embodiment.

FIG. 11 includes graphs for explaining a plurality of examples for controlling the polarity dependence of the MTJ element in the MRAM of the present embodiment.

(a) of FIG. 11 is a graph illustrating a relationship between the composition of a storage layer of the MTJ element and the polarity dependence of a magnetization reversal threshold of the MTJ element.

In (a) of FIG. 11, a horizontal axis of the graph corresponds to a composition ratio (%) of iron (Fe) in the storage layer. In (a) of FIG. 11, a vertical axis of the graph corresponds to a value indicating the polarity dependence of the MTJ element. The value indicating the polarity dependence is a ratio (Ic ratio=IcAPP/IcPAP) between a magnetization reversal threshold (IcAPP) of the MTJ element at the time of application of a write voltage VwAPP and a magnetization reversal threshold (IcPAP) of the MTJ element at the time of application of a write voltage VwPAP. A large Ic ratio means that the polarity dependence of the MTJ element on the write voltage (write current) is large. A small Ic ratio means that the polarity dependence of the MTJ element on the write voltage is small.

As illustrated in (a) of FIG. 11, the Ic ratio tends to increase as the composition ratio of iron in the storage layer increases.

(b) of FIG. 11 is a graph showing a relationship between the composition of the storage layer of the MTJ element and the polarity dependence of the magnetization reversal threshold of the MTJ element.

In (b) of FIG. 11, a horizontal axis of the graph corresponds to a composition ratio of boron (B) in the storage layer. In (b) of FIG. 11, a vertical axis of the graph corresponds to the Ic ratio (IcAPP/IcPAP) of the MTJ element.

As illustrated in (b) of FIG. 11, the Ic ratio tends to increase as the composition ratio of boron in the storage layer increases.

However, the tendency of the change in Ic ratio by the control of the composition ratio of boron is different from the tendency of the change in Ic ratio by the control of the composition ratio of iron.

When the composition ratio of iron in the storage layer is controlled, the Ic ratio increases relatively gently as the composition of iron in the storage layer increases. On the other hand, when the composition ratio of boron in the storage layer is controlled, the Ic ratio increases relatively steeply when the composition of boron in the storage layer exceeds a certain value.

As illustrated in (a) and (b) of FIG. 11, the polarity dependence of the MTJ element on the write voltage (or the write current) can be controlled by controlling a member (for example, composition of an element) constituting the storage layer. Furthermore, the tendency of the change in polarity dependence can be controlled according to the element controlled in composition among the elements constituting the storage layer.

(c) of FIG. 11 is a graph illustrating a relationship between a thickness (film thickness) of the storage layer of the MTJ element and the polarity dependence of the magnetization reversal threshold of the MTJ element.

In (c) of FIG. 11, a horizontal axis of the graph corresponds to the film thickness of the storage layer. In (c) of FIG. 11, a vertical axis of the graph corresponds to the Ic ratio (IcAPP/IcPAP) of the MTJ element.

As illustrated in (c) of FIG. 11, the Ic ratio tends to decrease as the film thickness of the storage layer increases.

In this manner, the polarity dependence of the MTJ element on the write voltage can be controlled by controlling the thickness of the storage layer.

As in the present embodiment, as a result of controlling the polarity dependence of the MTJ element on the write voltage (write current), the polarity dependence of the memory cell on the write voltage (write current) can be controlled.

As a result, the MRAM of the present embodiment can improve the operation margin of the memory device.

Therefore, the memory device of the third embodiment can improve the operating characteristics of the memory device.

(4) Others

In the above-described embodiment, the MRAM has been exemplified as the memory device of the present embodiment. However, the memory device of the present embodiment may be a magnetic memory other than the MRAM as long as a magnetoresistive effect element (for example, an MTJ element) is used as the memory element.

The memory device of the present embodiment may be a memory device other than the magnetic memory as long as the memory device includes a switching element having polarity dependence on write voltages having a plurality of polarities. For example, the memory device of the present embodiment may be a memory device (for example, a resistance change memory such as an ReRAM) using a variable resistance element (for example, a transition metal oxide element) as a memory element, a memory device (for example, a phase change memory such as a PCRAM) using a phase change element as a memory element, or a memory device (for example, a ferroelectric memory such as an FeRAM) using a ferroelectric element as a memory element.

The memory device of the present embodiment can provide the effects described in the above-described embodiments even if the memory device is a memory device other than the MRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a memory cell including a memory element and a switching element; and
   a circuit that applies a first write pulse having a first polarity to the memory cell at the time of writing first data in the memory cell and applies a second write pulse having a second polarity different from the first polarity to the memory cell at the time of writing second data in the memory cell,
   wherein
   the switching element has polarity dependence according to the first and second polarities.

2. The memory device according to claim 1, wherein
a first threshold voltage of the switching element when the first write pulse is applied is different from a second threshold voltage of the switching element when the second write pulse is applied.

3. The memory device according to claim 1, wherein
when the first write pulse is indicated by "VwAPP", the second write pulse is indicated by "VwPAP", a ratio between the first and second write pulses is indicated by "a", and the polarity dependence of the switching element is indicated by "b", "a" has a relationship of Formula (1), and "b" has a relationship of Formula (2):

$$a = VwPAP/VwAPP \quad (1)$$

$$1 < b < a^2 \quad (2).$$

4. The memory device according to claim 3, wherein
the "b" is equal to the "a".

5. The memory device according to claim 1, wherein
a first resistance value of the switching element when the first write pulse is applied is different from a second resistance value of the switching element when the second write pulse is applied.

6. The memory device according to claim 1, wherein
the switching element includes a first electrode, a second electrode, and a first layer between the first electrode and the second electrode, and
a material of the first electrode is different from a material of the second electrode.

7. The memory device according to claim 1, wherein
the polarity dependence of the switching element is set based on a condition for forming the switching element.

8. The memory device according to claim 1, wherein
the memory element has polarity dependence according to the first and second polarities.

9. The memory device according to claim 1, wherein
the memory element is a magnetoresistive effect element, the magnetoresistive effect element includes:
a first magnetic layer having a variable magnetization direction;
a second magnetic layer having an invariable magnetization direction; and
an insulating layer between the first magnetic layer and the second magnetic layer, and
polarity dependence of the magnetoresistive effect element on the first and second write pulses is set by controlling at least one of a dimension of the first magnetic layer and a composition of a constituent element of the first magnetic layer.

10. A memory device comprising:
a memory cell including a memory element and a switching element; and
a circuit that applies a first write pulse having a first polarity to the memory cell at the time of writing first data in the memory cell and applies a second write pulse having a second polarity different from the first polarity to the memory cell at the time of writing second data in the memory cell,
wherein
a first resistance value of the switching element when the first write pulse is applied is different from a second resistance value of the switching element when the second write pulse is applied.

11. The memory device according to claim 10, wherein
a first threshold voltage of the switching element when the first write pulse is applied is different from a second threshold voltage of the switching element when the second write pulse is applied.

12. The memory device according to claim 10, wherein
the switching element has polarity dependence according to the first and second polarities.

13. The memory device according to claim 12, wherein
when the first write pulse is indicated by "VwAPP", the second write pulse is indicated by "VwPAP", a ratio between the first and second write pulses is indicated by "a", and the polarity dependence of the switching element is indicated by "b", "a" has a relationship of Formula (1), and "b" has a relationship of Formula (2):

$$a = VwPAP/VwAPP \quad (1)$$

$$1 < b < a^2 \quad (2).$$

14. The memory device according to claim 13, wherein
the "b" is equal to the "a".

15. The memory device according to claim 10, wherein
the switching element includes a first electrode, a second electrode, and a first layer between the first electrode and the second electrode, and
a material of the first electrode is different from a material of the second electrode.

16. The memory device according to claim 10, wherein
a difference between the first resistance value and the second resistance value of the switching element is set based on a condition for forming the switching element.

17. The memory device according to claim 10, wherein
the memory element has polarity dependence according to the first and second polarities.

18. The memory device according to claim 10, wherein
the memory element is a magnetoresistive effect element, the magnetoresistive effect element includes:
a first magnetic layer having a variable magnetization direction;
a second magnetic layer having an invariable magnetization direction; and
an insulating layer between the first magnetic layer and the second magnetic layer, and
polarity dependence of the magnetoresistive effect element on the first and second write pulses is set by controlling at least one of a dimension of the first magnetic layer and a composition of a constituent element of the first magnetic layer.

* * * * *